(12) United States Patent
Tayu

(10) Patent No.: US 12,360,246 B2
(45) Date of Patent: Jul. 15, 2025

(54) IMAGING ELEMENT, DISTANCE MEASURING DEVICE, AND ELECTRONIC DEVICE

(71) Applicant: SONY SEMICONDUCTOR SOLUTIONS CORPORATION, Kanagawa (JP)

(72) Inventor: Kenichi Tayu, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 290 days.

(21) Appl. No.: 17/791,779

(22) PCT Filed: Jan. 6, 2021

(86) PCT No.: PCT/JP2021/000239
§ 371 (c)(1),
(2) Date: Jul. 8, 2022

(87) PCT Pub. No.: WO2021/145256
PCT Pub. Date: Jul. 22, 2021

(65) Prior Publication Data
US 2023/0058408 A1   Feb. 23, 2023

(30) Foreign Application Priority Data

Jan. 16, 2020   (JP) .................. 2020-005337

(51) Int. Cl.
*G01S 17/89*     (2020.01)
*G01S 7/481*     (2006.01)
(Continued)

(52) U.S. Cl.
CPC ............ *G01S 17/89* (2013.01); *G01S 7/4816* (2013.01); *H04N 25/617* (2023.01);
(Continued)

(58) Field of Classification Search
CPC ...... G01S 17/89; G01S 7/4816; G01S 7/4865; G01S 17/894; G01S 17/93; G01S 17/931;
(Continued)

(56) References Cited

U.S. PATENT DOCUMENTS 6,630,957 B1   10/2003  Kuroda et al.
2009/0084937 A1   4/2009  Sugiyama et al.
(Continued)

FOREIGN PATENT DOCUMENTS

JP    09-252436 A   9/1997
JP    11-220663 A   8/1999
(Continued)

OTHER PUBLICATIONS

International Search Report and Written Opinion of PCT Application No. PCT/JP2021/000239, issued on Mar. 30, 2021, 10 pages of ISRWO.

*Primary Examiner* — Lin Ye
*Assistant Examiner* — Tuan H Le
(74) *Attorney, Agent, or Firm* — CHIP LAW GROUP

(57) ABSTRACT

Provided are an imaging element, a distance measuring device, and an electronic device capable of improving resolution of a distance image while preventing generation of electromagnetic noise.

An imaging element according to the present disclosure includes: a signal generator configured to generate a clock signal; a plurality of flip-flops connected in a cascade manner; a circuit block configured to supply a first signal to a clock terminal of each of the plurality of flip-flops and to supply a second signal to an input terminal of a first-stage flip-flop of the plurality of flip-flops in accordance with the clock signal; and a pixel array including pixels configured to be driven using pulse signals supplied from different stages of the plurality of flip-flops.

15 Claims, 19 Drawing Sheets

(51) Int. Cl.
*H04N 25/617* (2023.01)
*H04N 25/76* (2023.01)
*H04N 25/767* (2023.01)
*H04N 25/77* (2023.01)
*H04N 25/779* (2023.01)
*H10F 39/00* (2025.01)
*H10F 39/18* (2025.01)

(52) U.S. Cl.
CPC ........... *H04N 25/767* (2023.01); *H04N 25/77* (2023.01); *H04N 25/779* (2023.01); *H04N 25/7795* (2023.01); *H04N 2201/04767* (2013.01); *H10F 39/184* (2025.01); *H10F 39/8057* (2025.01); *H10F 39/8063* (2025.01)

(58) Field of Classification Search
CPC .. G01S 7/4863; H04N 25/745; H04N 25/767; H04N 25/77; H04N 25/7795; H04N 25/617; H04N 2201/04767; H04N 25/779; H04N 25/705; H04N 25/531; H04N 25/621; H04N 25/67; H04N 25/633; H01L 27/14623; H01L 27/14627; H01L 27/14649; H01L 27/144; H01L 27/146
See application file for complete search history.

(56) References Cited

U.S. PATENT DOCUMENTS

2012/0274823 A1* 11/2012 Matsuda ............. H04N 25/621
　　　　　　　　　　　　　　　　　　　　　348/E5.091
2019/0230304 A1* 7/2019 Moore ................... G01S 17/10

FOREIGN PATENT DOCUMENTS

| JP | 2002-314882 A | 10/2002 |
| JP | 2006-295833 A | 10/2006 |
| JP | 2008187511 A | 8/2008 |
| JP | 2014158114 A | 8/2014 |
| JP | 2018117117 A | 7/2018 |
| WO | WO-2005013107 A1 | 2/2005 |
| WO | 2019/123825 A1 | 6/2019 |

* cited by examiner

IMAGING ELEMENT, DISTANCE MEASURING DEVICE, AND ELECTRONIC DEVICE

CROSS REFERENCE TO RELATED APPLICATIONS

This application is a U.S. National Phase of International Patent Application No. PCT/JP2021/000239 filed on Jan. 6, 2021, which claims priority benefit of Japanese Patent Application No. JP 2020-005337 filed in the Japan Patent Office on Jan. 16, 2020. Each of the above-referenced applications is hereby incorporated herein by reference in its entirety.

TECHNICAL FIELD

The present disclosure relates to an imaging element, a distance measuring device, and an electronic device.

BACKGROUND ART

A distance measuring technique using an indirect time of flight (ToF) method is known. In such a distance measuring system, a sensor which detects reflected light obtained by reflection of light emitted from a light source at a predetermined phase by an object and distributes charge of an optical signal to different regions is used. If a sensor of an indirect ToF method is used, it is possible to perform distance measurement on the basis of a signal distributed to each charge accumulation region in accordance with a phase of incident light. In the distance measurement through an indirect ToF method, a sensor in which a plurality of pixels is two-dimensionally disposed is generally used. In recent years, the number of pixels mounted on a sensor has increased in order to obtain a distance image with higher resolution.

CITATION LIST

Patent Document

Patent Document 1: Japanese Patent Application Laid-Open No. 2018-117117

SUMMARY OF THE INVENTION

Problems to be Solved by the Invention

In an indirect ToF method sensor, a drive signal is supplied to each pixel to detect charge corresponding to incident light. In the case in which the number of pixels to which the drive signal is supplied is increased, a drive signal with a larger current is required. In the case in which the total current of the drive signal increases, electromagnetic noise generated at the time of detecting incident light becomes large and there is a concern concerning requirements relating to electro-magnetic compatibility (EMC) which cannot be satisfied.

Therefore, the present disclosure provides an imaging element, a distance measuring device, and an electronic device capable of improving resolution of a distance image while preventing generation of electromagnetic noise.

Solutions to Problems

An imaging element according to an aspect of the present disclosure includes: a signal generator configured to generate a clock signal; a plurality of flip-flops connected in a cascade manner; a circuit block configured to supply a first signal to a clock terminal of each of the plurality of flip-flops and to supply a second signal to an input terminal of a first-stage flip-flop of the plurality of flip-flops in accordance with the clock signal; and a pixel array including pixels configured to be driven using pulse signals supplied from different stages of the plurality of flip-flops.

The pixel in the pixel array may include a signal taking-out unit configured to detect charges generated through photoelectric conversion if the pulse signal is supplied.

The pixel in the pixel array may include a plurality of the signal taking-out units, and each of the signal taking-out units may be configured to detect the charges generated at different timings.

The imaging element may further include a plurality of clock distribution circuits connected to the stage of any one of the plurality of flip-flops on an input side and connected to the pixel in the pixel array via a drive line on an output side.

At least one of the clock distribution circuits may be of a clock tree method.

A pixel column or a pixel row in the pixel array may be configured to be driven using the pulse signal supplied from the common stage of the plurality of flip-flops.

The pulse signal may be configured to be supplied from the different stages of the plurality of flip-flops depending on a region in the pixel array in which the pixel is disposed.

The imaging element may further include a multiplexer configured to select the pulse signal supplied to the pixel in the pixel array.

The circuit block may be configured to output the first signal having a first frequency and output the second signal having a second frequency different from the first frequency.

The circuit block may be configured to output the first signal and the second signal in synchronization with each other.

The circuit block may further include a frequency divider circuit which generates the first signal on the basis of the clock signal.

The circuit block may be configured to output the first signal having a first frequency equal to a clock frequency of the clock signal.

The imaging element may further include a control unit configured to output a control signal to the circuit block and the circuit block may be configured to adjust a first frequency of the first signal or a second frequency of the second signal on the basis of a supplied control signal.

A distance measuring device according to an aspect of the present disclosure may include: a signal generator configured to generate a clock signal; a plurality of flip-flops connected in a cascade manner; a circuit block configured to supply a first signal to a clock terminal of each of the plurality of flip-flops and to supply a second signal to an input terminal of a first-stage flip-flop of the plurality of flip-flops in accordance with the clock signal; a pixel array including pixels configured to be driven using pulse signals supplied from different stages of the plurality of flip-flops; and a signal processing unit configured to generate a distance image on the basis of a charge generated by photoelectric conversion in the pixel of the pixel array.

An electronic device according to an aspect of the present disclosure may include: a signal generator configured to generate a clock signal; a plurality of flip-flops connected in a cascade manner; a circuit block configured to supply a first signal to a clock terminal of each of the plurality of flip-flops and to supply a second signal to an input terminal of a first-stage flip-flop of the plurality of flip-flops in accordance with the clock signal; and a pixel array including pixels configured to be driven using pulse signals supplied from different stages of the plurality of flip-flops.

MODE FOR CARRYING OUT THE INVENTION

Figure 1:
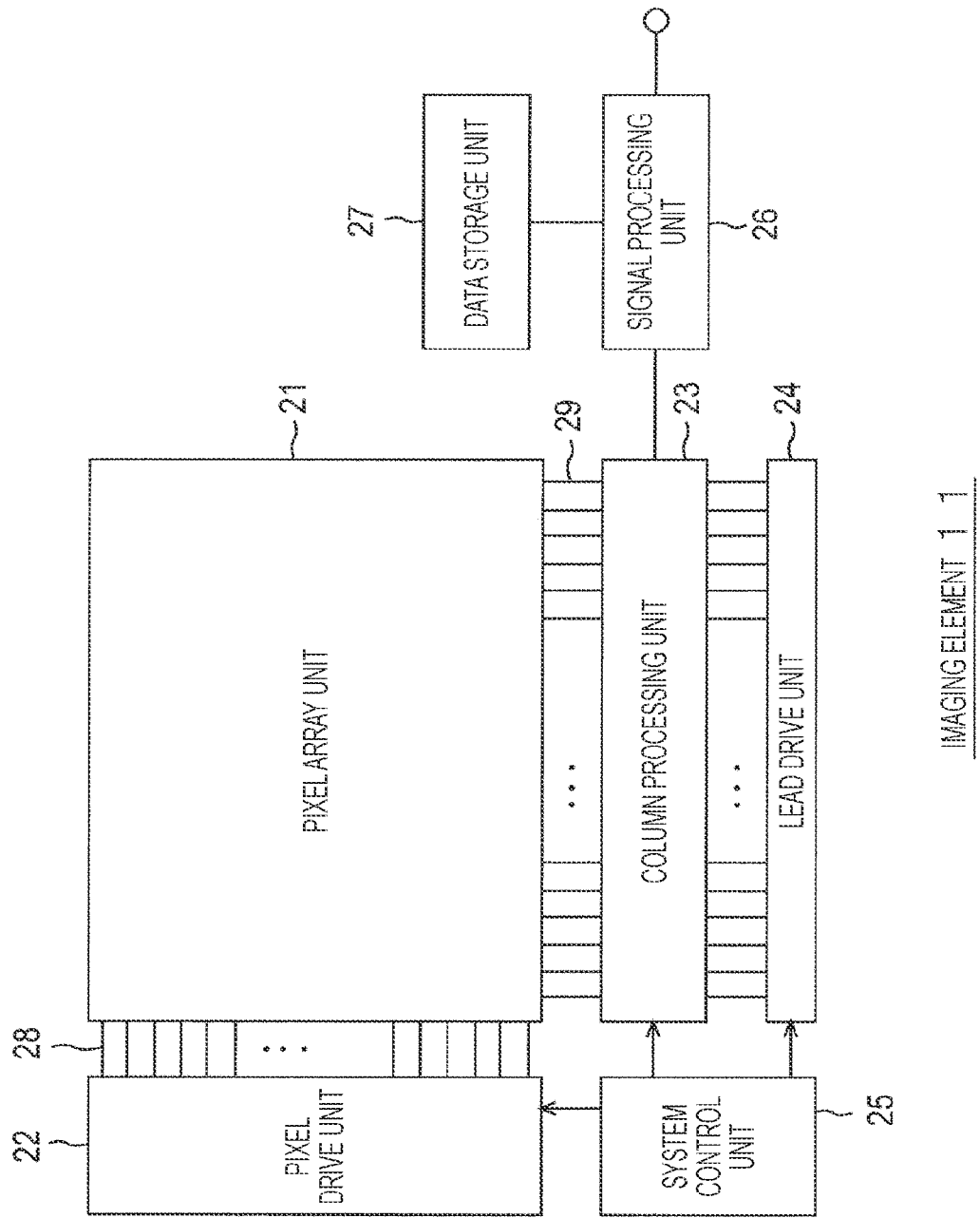
FIG. 1 is a block diagram illustrating an example of an imaging element according to the present disclosure.

Preferred embodiments of the present disclosure will be described in detail below with reference to the accompanying drawings. Note that, in the present specification and the drawings, constituent elements having substantially the same functional configuration are denoted by the same reference numerals and duplicate description thereof will be omitted.

The present disclosure is to prevent generation of electromagnetic noise in an imaging element installed in a distance measuring system (distance measuring device) that performs distance measurement through an indirect time of flight (ToF) method. The imaging element may be installed in various electronic devices.

As an example of the distance measuring system, there is an in-vehicle system which is installed in a vehicle and measures a distance from an object outside the vehicle. Furthermore, the distance measuring system may be applied to a gesture recognition system or the like which measures a distance from an object such as a user's hand and recognizes the user's gesture on the basis of a measurement result. For example, an operation of a car navigation system can be performed using the result of the gesture recognition. Here, the result of the gesture recognition may be used for other purposes.

The block diagram of FIG. 1 illustrates an example of an imaging element (light receiving element) according to the present disclosure.

An imaging element 11 in FIG. 1 is, for example, a back-surface irradiation type sensor, and is installed in an imaging device having a distance measuring function. Here, the imaging element 11 may be a front-surface irradiation type sensor.

The imaging element 11 includes, for example, a pixel array unit 21 formed on a semiconductor substrate (not illustrated) and a peripheral circuit unit integrated on a semiconductor substrate that is the same as that of the pixel array unit 21. The peripheral circuit unit includes, for example, a pixel drive unit 22, a column processing unit 23, a lead drive unit 24, and a system control unit 25.

The imaging element 11 may further include a signal processing unit 26 and a data storage unit 27. The signal processing unit 26 and the data storage unit 27 may be installed in a substrate that is the same as that of the imaging element 11 or may be installed in a substrate that is different from that of the imaging element 11.

In the pixel array unit 21, for example, unit pixels are disposed in an array form. The unit pixels (hereinafter, also referred to as "pixels") generate charges corresponding to an amount of received light and outputs a signal according to the charges. For example, the pixels are disposed in two directions that are a row direction and a column direction in the pixel array. Here, the pixels may be formed in any two-dimensional array in the pixel array unit 21. That is to say, the pixel array unit 21 includes a plurality of pixels which photoelectrically convert incident light and output a signal according to charges obtained through the photoelectric conversion.

Here, the row direction refers to a "direction in which pixels in a pixel row are disposed" (that is, in a horizontal direction). In addition, the column direction refers to a "direction in which pixels in a pixel column are disposed" (that is, in a vertical direction). The row direction corresponds to the horizontal direction in the drawings and the column direction corresponds to the vertical direction in the drawing.

In the pixel array unit 21, a pixel drive line 28 is wired in the row direction for each pixel row with respect to a pixel array in a matrix form. Further, two vertical signal lines 29 are wired in the column direction in each pixel column. For example, the pixel drive line 28 transmits a drive signal for performing driving at the time of reading a signal from a pixel. Although the pixel drive line 28 is illustrated as one signal line In FIG. 1, the number of signal lines is not limited to one. An end of the pixel drive line 28 is connected to an output end corresponding to each row of the pixel drive unit 22.

The pixel drive unit 22 is a circuit that drives some of the pixels in the pixel array unit 21 in a predetermined order. A combination of pixels driven by the pixel drive unit 22 at each time and an order in which each combination of pixels is driven are referred to as a "pixel drive pattern". The pixel drive unit 22 according to the present disclosure prevents electromagnetic noise from being generated by reducing the number of pixels simultaneously driven in the pixel array unit 21. The pixel drive unit 22 includes, for example, a shift register or an address decoder. The pixel drive unit 22 forms a drive unit that controls an operation of each pixel in the pixel array unit 21 together with the system control unit 25 that controls the pixel drive unit 22. Details of the pixel drive unit according to the present disclosure will be described later.

In the imaging element used for distance measurement through the indirect ToF method, the accuracy of a drive timing depends on the number of elements connected to the same control line. In the pixel array of the imaging element used for distance measurement through the indirect ToF method, since a length of the control line in the horizontal direction increases, a drive timing is likely to be delayed. For this reason, the pixel may be driven using not only the control line in the horizontal direction but also, for example, other signal lines such as the vertical signal lines 29. In this case, a drive signal may be output to each of the vertical signal lines 29 from a drive unit (for example, a lead drive unit) provided separately from the pixel drive unit 22.

A signal output from each pixel of the pixel row in accordance with the drive control using the pixel drive unit 22 is input to the column processing unit 23 via the vertical signal line 29. The column processing unit 23 performs predetermined signal processing on the signal output from each pixel via the vertical signal line 29 and temporarily holds the pixel signal which has been subjected to the signal processing. The column processing unit 23 may perform at least one of noise removal processing or analog to digital (AD) conversion processing as signal processing. Although examples of the noise removal processing include correlated double sampling (CDS), other types of processing may be performed.

The lead drive unit 24 includes, for example, a shift register, an address decoder, and the like and sequentially selects unit circuits corresponding to pixel columns of the column processing unit 23. Through the selective scanning using the lead drive unit 24, the pixel signals subjected to the signal processing for each unit circuit in the column processing unit 23 are sequentially output.

The system control unit 25 includes, for example, a timing generator which generates various timing signals. The system control unit 25 performs drive control of the pixel drive unit 22, the column processing unit 23, the lead drive unit 24, and the like on the basis of various timing signals generated by the timing generator.

The signal processing unit 26 has at least an arithmetic processing function and performs various signal processing such as arithmetic processing on the basis of the pixel signal output from the column processing unit 23. The data storage unit 27 temporarily stores data required for signal-processing in the signal processing unit 26 in the processing.

Figure 2:
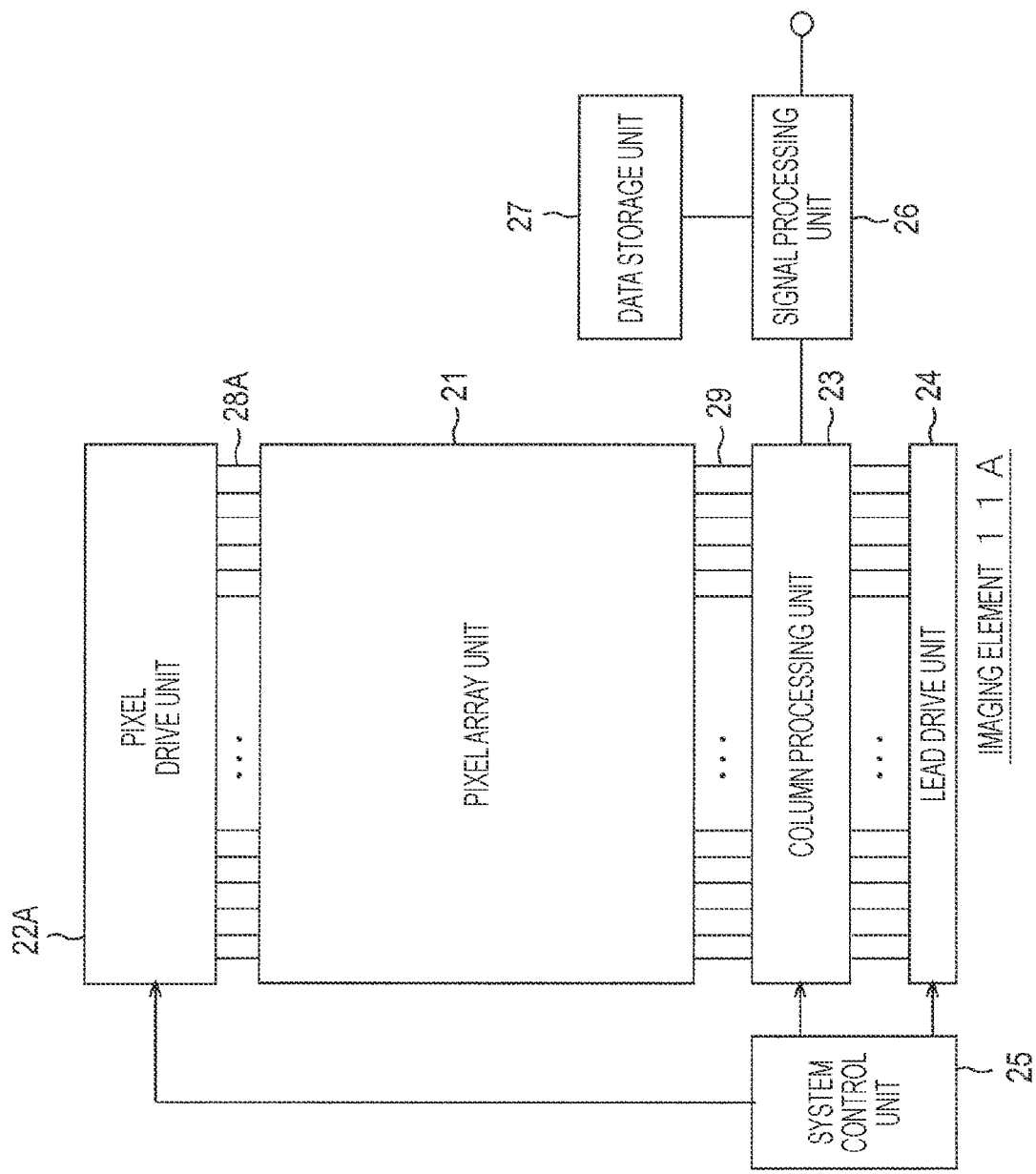
FIG. 2 is a block diagram illustrating an example of an imaging element in which pixels are driven in a vertical direction.

The block diagram of FIG. 2 illustrates an example of an imaging element according to Modification 1. As in the example of FIG. 2, the pixel drive unit 22 may be connected to the pixel array in the pixel array unit 21 via a pixel drive line 28A wired in the vertical direction. In this case, as in FIG. 1, two vertical signal lines 29 may be wired in the column direction in each pixel column. Furthermore, as will be described later, the pixel drive unit 22 may output a drive signal to a first pixel drive line wired in the vertical direction and a second pixel drive line wired in the horizontal direction and drive the pixels in the pixels in the pixel array unit 21. As described above, a direction and a combination of the signal lines (pixel drive lines) for driving the pixels in the pixel array unit 21 are not limited.

<Example of Configuration of Pixel>

Figure 3:
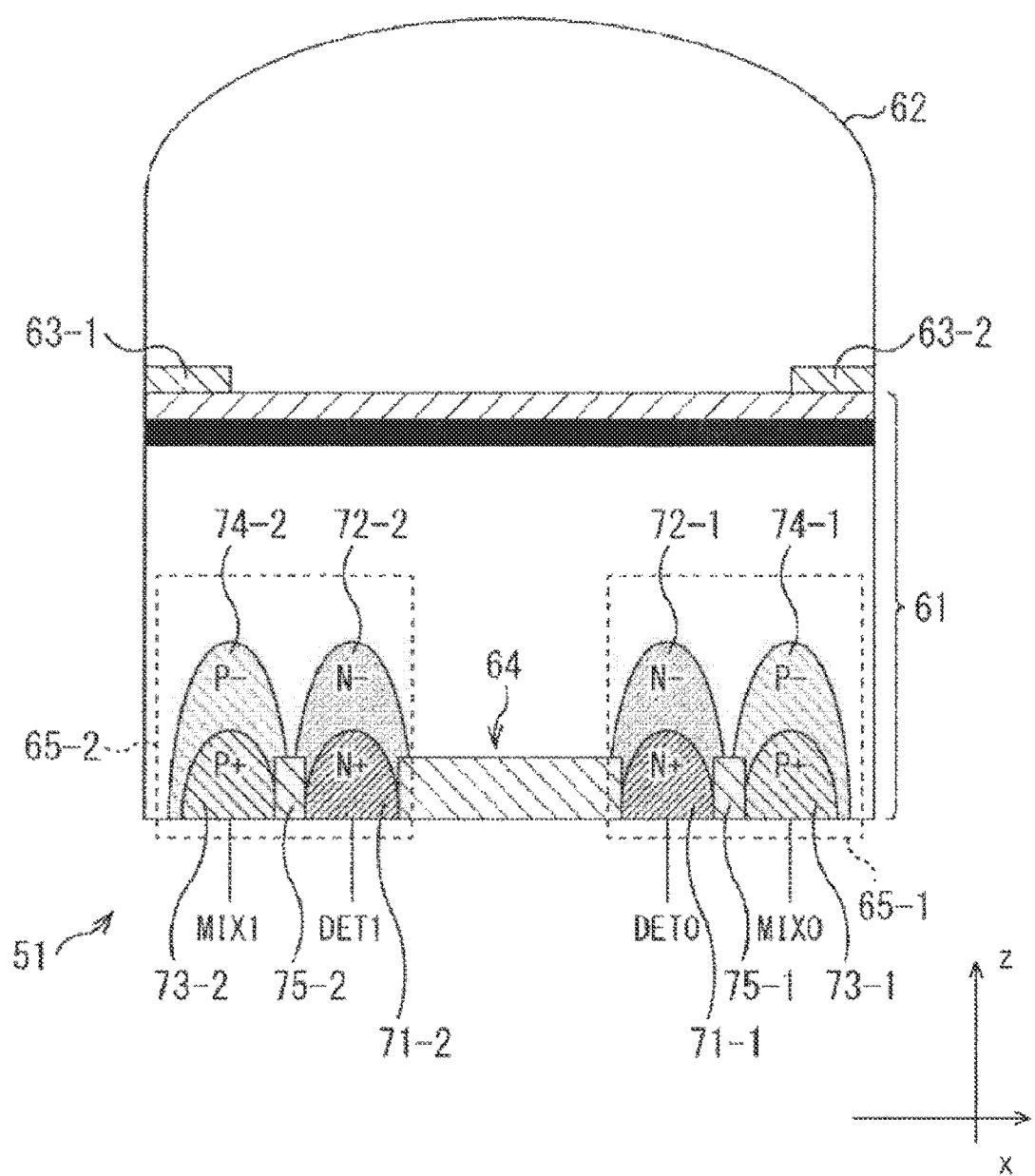
FIG. 3 is a diagram illustrating an example of a configuration of a pixel in an imaging element.
Figure 4:
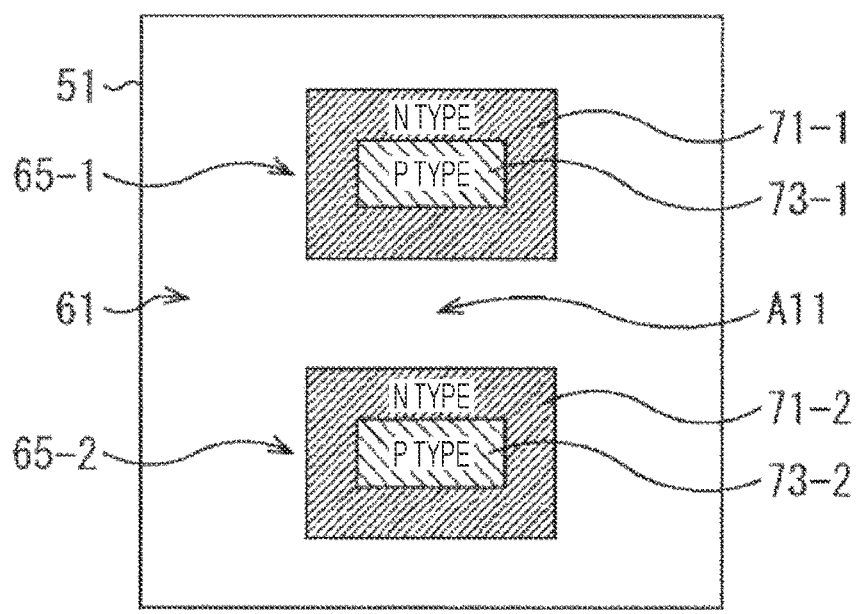
FIG. 4 is a diagram illustrating an example of a signal taking-out unit in a pixel.

An example of a configuration of a pixel provided in the pixel array unit 21 will be described below. FIG. 3 illustrates an example of a pixel provided in the pixel array unit 21.

FIG. 3 illustrates a cross section of one pixel 51 provided in the pixel array unit 21. The pixel 51 receives light incident from the outside, photoelectrically converts the light, and outputs a signal according to charges obtained as a result. The pixel 51 can receive, for example, infrared light. Here, a wavelength of electromagnetic waves received by the pixel 51 is not limited.

The pixel 51 includes, for example, a substrate 61 (semiconductor layer) and an on-chip lens 62 formed on the substrate 61. As the substrate 61, for example, a silicon substrate including a P-type semiconductor region can be used.

For example, a thickness of the substrate 61 in a z axis direction (thickness in a direction perpendicular to a surface of the substrate 61) is set to 20 μm or less. Here, the thickness of the substrate 61 may be 20 μm or more. The thickness of the substrate 61 can be determined depending on a design and use of the imaging element 11.

As the substrate 61, for example, a high-resistance P-Epi substrate having a substrate concentration in an order of 1E+13 or less can be used. In this case, the resistance (resistivity) of the substrate 61 is, for example, 500 [Ωcm] or more.

A value of the resistance of the substrate 61 depends on the substrate concentration. For example, when the substrate concentration is 6.48 E+12 [cm3], the resistance is 2000 [Ωcm]. Also, when the substrate concentration is 1.30 E+13 [cm3], the resistance is 1000 [Ωcm]. When the substrate concentration is 2.59 E+13 [cm3], the resistance is 500 [Ωcm]. Furthermore, when the substrate concentration is 1.30 E+14 [cm3], the resistance is 100 [Ωcm].

On a surface of the substrate 61 on a z-axis positive direction side, that is, on a surface on a side on which light from the outside is incident on the substrate 61 (hereinafter also referred to as an "incident surface"), an on-chip lens 62 which condenses light incident from the outside and causes the light to be incident on the substrate 61 is formed.

Furthermore, in the pixel 51, an inter-pixel light shielding unit 63-1 and an inter-pixel light shielding unit 63-2 for preventing color mixing between neighboring pixels are formed at an end portion of the pixel 51 on an incident surface of the substrate 61.

In this example, light from the outside is incident on the substrate 61 via the on-chip lens 62. It is preferable that light incident from the outside pass through the on-chip lens 62 and a part of the substrate 61 and be not incident on a region of another pixel provided adjacent to the pixel 51 in the substrate 61. In the example of FIG. 3, light which is incident on the on-chip lens 62 from the outside and directed into another pixel adjacent to the pixel 51 is shielded by the inter-pixel light shielding unit 63-1 and the inter-pixel light shielding unit 63-2 and is prevented from being incident on another neighboring pixel. In the case in which it is not necessary to particularly distinguish the inter-pixel light shielding unit 63-1 and the inter-pixel light shielding unit 63-2, they are also simply referred to as an "inter-pixel light shielding unit 63".

Since the imaging element 11 is a back-surface irradiation type sensor, the incident surface of the substrate 61 is a so-called back surface of the substrate 61. A wiring layer including wiring and the like is not formed on a back surface side of the substrate 61. Furthermore, a wiring layer in which a wiring for driving a transistor or the like formed in the pixel 51 in a stacked structure, a wiring for reading a signal from the pixel 51, and the like are formed is formed in a portion of a surface of the substrate 61 on a side opposite to the incident surface.

On a surface side in the substrate 61 opposite to the incident surface, that is, on a portion inside a surface on a z-axis negative direction side, an oxide film 64, and a signal taking-out unit 65-1 and a signal taking-out unit 65-2 called a tap are formed.

In this example, the oxide film 64 is formed in a center portion of the pixel 51 in the vicinity of the surface of the substrate 61 opposite to the incident surface, and the signal taking-out unit 65-1 and the signal taking-out unit 65-2 are formed at both ends of the oxide film 64, respectively.

Here, the signal taking-out unit 65-1 includes an N+ semiconductor region 71-1, an N+ semiconductor region 71-1, an N− semiconductor region 72-1, a P+ semiconductor region 73-1, and a P− semiconductor region 74-1. The N+ semiconductor region 71-1 is an N type semiconductor region. The N− semiconductor region 72-1 is an N type semiconductor region having a donor impurity concentration lower than that of the N+ semiconductor region 71-1. The P+ semiconductor region 73-1 is a P type semiconductor region. The P− semiconductor region 74-1 is a P type semiconductor region having an acceptor impurity concentration lower than that of the P+ semiconductor region 73-1. For example, in the case in which a silicon (Si) substrate is used, an element belonging to Group 5 in the periodic table of elements such as phosphorus (P) or arsenic (As) can be used as a donor impurity. In this case, for example, an element belonging to Group 3 in the periodic table of elements such as boron (B) can be used as an acceptor impurity. The element that is the donor impurity is also referred to as a "donor element" and the element that is the acceptor impurity is also referred to as an "acceptor element".

The N+ semiconductor region 71-1 is formed at a position of the oxide film 64 on an x-axis positive direction side in the vicinity of the surface of the substrate 61 opposite to the incident surface. Furthermore, the N− semiconductor region 72-1 is formed on the z-axis positive direction side of the N+ semiconductor region 71-1 to cover (surround) the N+ semiconductor region 71-1.

Furthermore, the P+ semiconductor region 73-1 is formed at a position adjacent to the N+ semiconductor region 71-1 on the x-axis positive direction side in the vicinity of the surface of the substrate 61 opposite to the incident surface. Furthermore, the P− semiconductor region 74-1 is formed on the z-axis positive direction side of the P+ semiconductor region 73-1 to cover (surround) the P+ semiconductor region 73-1.

Note that, when the substrate 61 is viewed from a direction perpendicular to a surface of the substrate 61, the N+ semiconductor region 71-1 and the N− semiconductor region 72-1 may be formed centering on the P+ semiconductor region 73-1 and the P− semiconductor region 74-1 to surround the periphery of the P+ semiconductor region 73-1 and the P− semiconductor region 74-1.

Similarly, the signal taking-out unit 65-2 includes an N+ semiconductor region 71-2, an N− semiconductor region 72-2, a P+ semiconductor region 73-2, and a P− semiconductor region 74-2. The N+ semiconductor region 71-2 is an N type semiconductor region. The N− semiconductor region 72-2 is an N type semiconductor region having a donor impurity concentration lower than that of the N+ semiconductor region 71-2. The P+ semiconductor region 73-2 is a P type semiconductor region. The P− semiconductor region 74-2 is a P type semiconductor region having an acceptor impurity concentration lower than that of the P+ semiconductor region 73-2.

The N+ semiconductor region 71-2 is formed at a position adjacent to the oxide film 64 on an x-axis negative direction side in the vicinity of the surface of the substrate 61 opposite to the incident surface. Furthermore, the N− semiconductor region 72-2 is formed on the z-axis positive direction side of the N+ semiconductor region 71-2 to cover (surround) the N+ semiconductor region 71-2.

Furthermore, the P+ semiconductor region 73-2 is formed at a position adjacent to the N+ semiconductor region 71-2 on the x-axis negative axis direction side in the vicinity of the surface of the substrate 61 opposite to the incident surface. Furthermore, the P− semiconductor region 74-2 is formed on the z-axis positive direction side of the P+ semiconductor region 73-2 to cover (surround) the P+ semiconductor region 73-2.

Note that, when the substrate 61 is viewed from a direction perpendicular to a surface of the substrate 61, the N+ semiconductor region 71-2 and the N− semiconductor region 72-2 may be formed centering on the P+ semiconductor region 73-2 and the P− semiconductor region 74-2 to surround the periphery of the P+ semiconductor region 73-2 and the P− semiconductor region 74-2.

Hereinafter, in the case in which it is not necessary to particularly distinguish the signal taking-out unit 65-1 and the signal taking-out unit 65-2, they are also simply referred to as a "signal taking-out unit 65".

In addition, hereinafter, in the case in which it is not necessary to particularly distinguish the N+ semiconductor region 71-1 and the N+ semiconductor region 71-2, they are also simply referred to as an "N+ semiconductor region 71". In addition, in the case in which it is not necessary to particularly distinguish the N− semiconductor region 72-1 and the N− semiconductor region 72-2, they are also simply referred to as an "N− semiconductor region 72".

Furthermore, hereinafter, in the case in which it is not necessary to particularly distinguish the P+ semiconductor region 73-1 and the P+ semiconductor region 73-2, they are simply referred to as a "P+ semiconductor region 73". In addition, in the case in which it is not necessary to particularly distinguish the P− semiconductor region 74-1 and the P− semiconductor region 74-2, they are also simply referred to as a "P− semiconductor region 74".

Also, a separation portion 75-1 for separating the N+ semiconductor region 71-1 and the P+ semiconductor region 73-1 in the substrate 61 is formed between the N+ semiconductor region 71-1 and the P+ semiconductor region 73-1 in the substrate 61 using an oxide film or the like. Similarly, a separation portion 75-2 for isolating the N+ semiconductor region 71-2 and the P+ semiconductor region 73-2 is also formed between these regions using an oxide film or the like. Hereinafter, in the case in which it is not necessary to particularly distinguish the separation portion 75-1 and the separation portion 75-2, they are simply referred to as a "separation portion 75".

The N+ semiconductor region 71 provided in the substrate 61 functions as a charge detection unit for detecting an amount of light incident on the pixel 51 from the outside (an amount of signal carriers generated through photoelectric conversion using the substrate 61). Note that not only the N+ semiconductor region 71 but also the N− semiconductor region 72 having a low donor impurity concentration can be used as the charge detection unit. In addition, the P+ semiconductor region 73 functions as a voltage application unit for directly applying a voltage to the substrate 61 to generate an electric field in the substrate 61. At this time, a majority carrier current can be injected into the substrate 61. Note that, in addition to the P+ semiconductor region 73, the P− semiconductor region 74 having a low acceptor impurity concentration can also be used as a voltage application unit.

In the pixel 51, a floating diffusion (FD) portion (hereinafter also particularly referred to as an "FD portion A") that is a floating diffusion region (not illustrated) is directly connected to the N+ semiconductor region 71-1 and the FD portion A is further connected to the vertical signal lines 29 via an amplification transistor or the like (not illustrated).

Similarly, another FD portion (hereinafter also particularly referred to as an "FD portion B") different from the FD portion A is directly connected to the N+ semiconductor region 71-2 and the FD portion B is further connected to the vertical signal lines 29 via the amplification transistor or the like (not illustrated). Here, the FD portion A and the FD portion B are connected to different vertical signal lines 29.

For example, in the case in which the distance from the object is to be measured through the indirect ToF method, the object is irradiated with infrared light from the imaging device including the imaging element 11. Also, if the infrared light is reflected by the object and returns to the imaging device as reflected light, the substrate 61 of the imaging element 11 receives and photoelectrically converts the incident reflected light (infrared light).

At this time, the pixel drive unit 22 drives the pixel 51. As a result, a signal according to the charges obtained through photoelectric conversion can be distributed to the FD portion A and the FD portion B. Note that, as described above, the pixel 51 may be driven not by the pixel drive unit 22 but by a drive unit, the lead drive unit 24, or the like separately provided via the vertical signal line 29 or another control line wired in the vertical direction.

For example, at a certain timing, the pixel drive unit 22 applies a voltage to the two P+ semiconductor regions 73 via a contact or the like. For example, the pixel drive unit 22 applies a HIGH (for example, 1.5 V) voltage to the P+ semiconductor region 73-1, and applies a LOW voltage (for example, 0 V) to the P+ semiconductor region 73-2.

As a result, an electric field is generated between the two P+ semiconductor regions 73 in the substrate 61 and a current flows from the P+ semiconductor region 73-1 to the P+ semiconductor region 73-2. In this case, holes in the substrate 61 move in a direction of the P+ semiconductor region 73-2 and electrons move in a direction of the P+ semiconductor region 73-1.

Infrared light (reflected light) from the outside is incident on the substrate 61 via the on-chip lens 62 and the infrared light is photoelectrically converted in the substrate 61 to be converted into a pair of an electron and a hole. The electrons obtained in the above-described state are guided in the direction −1 of the P+ semiconductor region 73 due to the electric field between the P+ semiconductor regions 73 and move into the N+ semiconductor region 71-1.

In this case, electrons generated through photoelectric conversion are used as signal carriers (charges) for detecting a signal according to an amount of infrared light (an amount of received infrared light) incident on the pixel 51.

As a result, charges are accumulated in the N+ semiconductor region 71-1 in accordance with the electrons moving into the N+ semiconductor region 71-1. The accumulated charges are detected using the column processing unit 23 via a FD portion A, the amplification transistor, the vertical signal line 29, or the like.

The accumulated charges in the N+ semiconductor region 71-1 are transferred to the FD portion A directly connected to the N+ semiconductor region 71-1. Also, a signal according to the charges transferred to the FD portion A is read using the column processing unit 23 via the amplification transistor and the vertical signal line 29. Furthermore, the column processing unit 23 performs processing such as AD conversion processing on the read signal, and a pixel signal generated as a result is supplied to the signal processing unit 26.

This pixel signal is a signal indicating an amount of charges (an amount of charges accumulated in the FD portion A) according to the electrons detected using the N+ semiconductor region 71-1. That is to say, it can also be said that the pixel signal is a signal indicating an amount of infrared light received using the pixel 51.

Note that, as in the case of the N+ semiconductor region 71-1, a pixel signal according to the electrons detected in the N+ semiconductor region 71-2 may be used for distance measurement.

Furthermore, at the next timing, a voltage is applied to the two P+ semiconductor regions 73 using the pixel drive unit 22 via a contact or the like to generate an electric field in a direction opposite to that of the electric field generated in the substrate 61 so far. Specifically, for example, a HIGH (for example, 1.5 V) voltage is applied to the P+ semiconductor region 73-2, and a LOW voltage (for example, 0 V) is applied to the P+ semiconductor region 73-1.

As a result, an electric field is generated between the two P+ semiconductor regions 73 in the substrate 61 and a current flows from the P+ semiconductor region 73-2 to the P+ semiconductor region 73-1.

Infrared light (reflected light) from the outside is incident on the substrate 61 via the on-chip lens 62 and the infrared light is photoelectrically converted in the substrate 61 to generate a pair of an electron and a hole. In the above-described state, the generated electrons are guided in the direction of the P+ semiconductor region 73-2 due to the electric field between the P+ semiconductor regions 73 and move into the N+ semiconductor region 71-2.

As a result, charges corresponding to electrons moving into the N+ semiconductor region 71-2 are accumulated in the N+ semiconductor region 71-2. The accumulated charges are detected using the column processing unit 23 via an FD portion B, the amplification transistor, the vertical signal line 29, and the like.

The accumulated charges in the N+ semiconductor region 71-2 are transferred to the FD portion B directly connected to the N+ semiconductor region 71-2. Also, a signal according to the charges transferred to the FD portion B is read using the column processing unit 23 via the amplification transistor and the vertical signal line 29. Furthermore, the column processing unit 23 performs processing such as AD conversion processing on the read signal and the pixel signal generated as a result is supplied to the signal processing unit 26.

Note that, as in the case of the N+ semiconductor region 71-2, distance measurement may be performed using a pixel signal according to an electron detected in the N+ semiconductor region 71-1.

In this way, if pixel signals obtained through photoelectric conversion in different periods are obtained in the same pixel 51, the signal processing unit 26 calculates distance information indicating a distance from an object on the basis of these pixel signals and outputs the distance information to a circuit in a subsequent stage. The distance information may be, for example, a distance image including a distance value for each pixel.

As described above, a technique of distributing the signal carriers to the N+ semiconductor regions 71 different from each other and calculating the distance information on the basis of the signals corresponding to the signal carriers is referred to as an "indirect ToF method".

Note that, here, an example in which the voltage applied to the P+ semiconductor region 73 is controlled using the pixel drive unit 22 has been described. Here, as described above, a drive unit (block) functioning as a voltage application control unit which controls the voltage applied to the P+ semiconductor region 73 may be provided in the imaging element 11, separately from the pixel drive unit 22.

When the portion of the signal taking-out unit 65 in the pixel 51 is viewed from the z-axis positive direction (direction perpendicular to the surface of the substrate 61) in FIG. 2, for example, a structure in which the periphery of the P+ semiconductor region 73 is surrounded by the N+ semiconductor region 71 as illustrated in FIG. 3 may be adopted. Note that, in FIG. 3, constituent elements corresponding to those in FIG. 2 are denoted by the same reference numerals and description thereof will be omitted as appropriate.

In the example of FIG. 3, an oxide film 64 (not illustrated) is formed in a central portion of the pixel 51. Furthermore, the signal taking-out unit 65 is formed in a portion deviated from the center of the pixel 51. Two signal taking-out units 65 are formed in the pixel 51 of FIG. 3.

Also, in each of the signal taking-out units 65, a P+ semiconductor region 73 is formed in a rectangular shape at the center position thereof. In addition, the periphery of the P+ semiconductor region 73 is surrounded by the N+ semiconductor region 71 having a rectangular frame shape around the P+ semiconductor region 73. That is to say, the N+ semiconductor region 71 is formed to surround the periphery of the P+ semiconductor region 73.

Furthermore, in the pixel 51, the on-chip lens 62 is formed so that infrared light incident from the outside is condensed in the central portion of the pixel 51, that is, a portion indicated by an arrow A11. In other words, the infrared light incident on the on-chip lens 62 from the outside is condensed by the on-chip lens 62 at a position indicated by the arrow A11, that is, a position of the oxide film 64 on the z-axis positive direction side in FIG. 2.

Therefore, the infrared light is condensed at a position between the signal taking-out unit 65-1 and the signal taking-out unit 65-2. As a result, it is possible to prevent the infrared light from being incident on a pixel adjacent to the pixel 51 and color mixing from occurring and it is also possible to prevent the infrared light from being directly incident on the signal taking-out unit 65.

For example, if infrared light is directly incident on the signal taking-out unit 65, charge separation efficiency, contrast between active and inactive tap (Cmod), and modulation contrast are lowered.

The signal taking-out unit 65 (tap) from which the signal according to the charges (electrons) obtained through the photoelectric conversion is read is referred to as an "active tap".

The signal taking-out unit 65 (tap) from which the signal according to the charge obtained by the photoelectric conversion is not read, that is, the signal taking-out unit 65 that is not an active tap is referred to as an "inactive tap".

In the above example, the signal taking-out unit 65 to which a HIGH (for example, 1.5 V) voltage is applied to the P+ semiconductor region 73 is an active tap. In addition, the signal taking-out unit 65 to which a LOW (for example, 0 V) voltage is applied to the P+ semiconductor region 73 is an inactive tap.

The Cmod is an index indicating a percentage of charges of the charges generated through the photoelectric conversion of the incident infrared light which can be detected in the N+ semiconductor region 71 of the signal taking-out unit 65 that is an active tap, that is, whether a signal according to the charges can be taken out and indicates the charge separation efficiency.

Therefore, for example, when infrared light incident from the outside is incident on a region of an inactive tap and is subjected to photoelectric conversion in the inactive tap, electrons that are signal carriers generated through the photoelectric conversion are highly likely to move to the N+ semiconductor region 71 in the inactive tap. Thus, charges of some the electrons obtained through photoelectric conversion are not detected in the N+ semiconductor region 71 in the active tap and the Cmod (charge separation efficiency) decreases.

Therefore, in the pixel 51, the infrared light is condensed in the vicinity of the central portion of the pixel 51 at a position substantially equidistant from the two signal taking-out units 65 so that the probability that the infrared light incident from the outside is photoelectrically converted in the region of the inactive tap can be reduced and the charge separation efficiency can be improved. Furthermore, in the pixel 51, the modulation contrast can also be improved. That is to say, electrons obtained through photoelectric conversion are easily guided to the N+ semiconductor region 71 in the active tap.

<Example of Configuration of Equivalent Circuit of Pixel>

Figure 5:
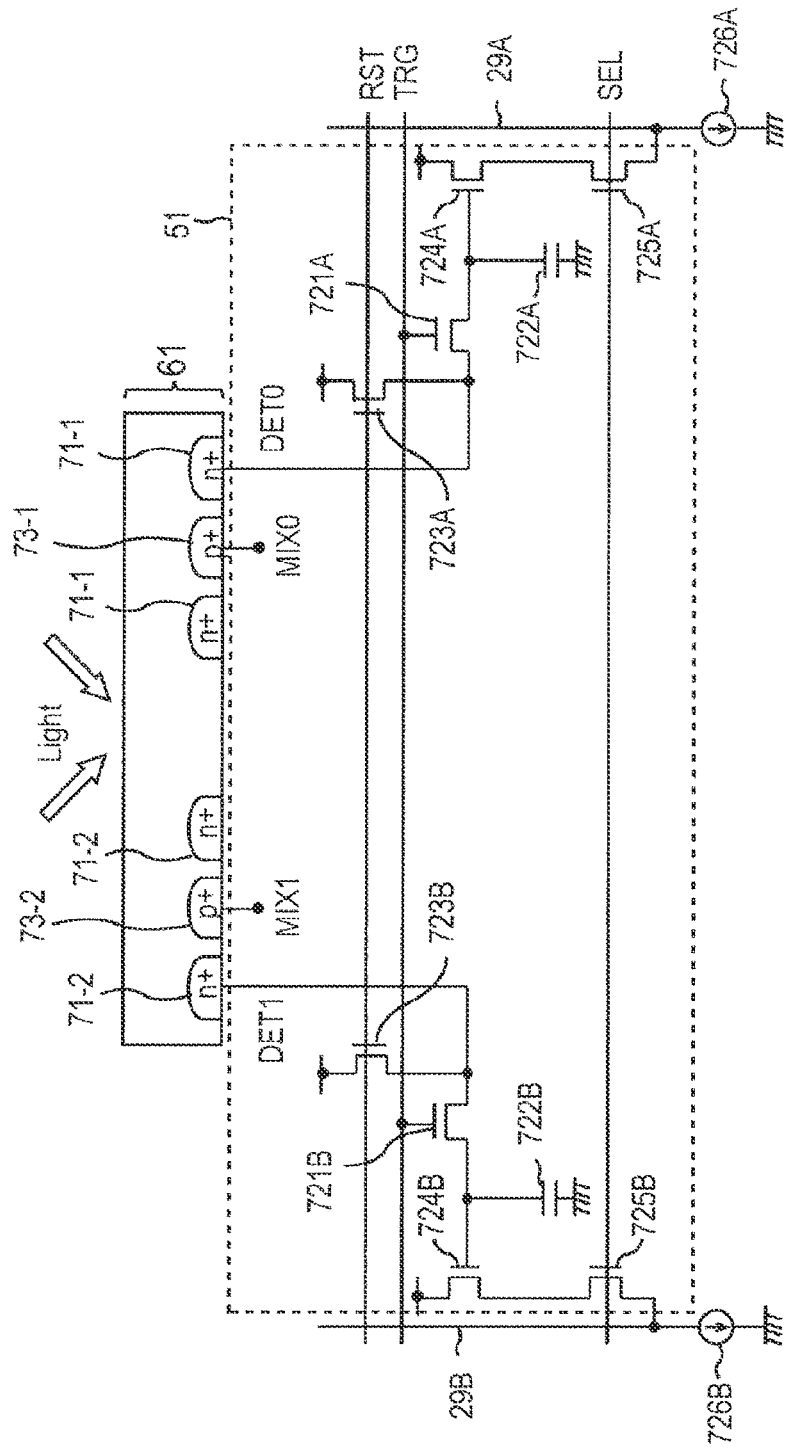
FIG. 5 is a diagram illustrating an example of an equivalent circuit of a pixel.

An example of a circuit configuration in a pixel will be described below. FIG. 5 illustrates an equivalent circuit of the pixel 51.

The pixel 51 includes a transfer transistor 721A, an FD 722A, a reset transistor 723A, an amplification transistor 724A, and a selection transistor 725A corresponding to the signal taking-out unit 65-1 including the N+ semiconductor region 71-1 and the P+ semiconductor region 73-1.

Furthermore, the pixel 51 includes a transfer transistor 721B, an FD 722B, a reset transistor 723B, an amplification transistor 724B, and a selection transistor 725B corresponding to the signal taking-out unit 65-2 including the N+ semiconductor region 71-2 and the P+ semiconductor region 73-2.

The pixel drive unit 22 applies a predetermined voltage MIX0 (first voltage) to the P+ semiconductor region 73-1 and applies a predetermined voltage MIX1 (second voltage) to the P+ semiconductor region 73-2. In the above example, one of the voltages MIX0 and MIX1 is HIGH (for example, 1.5 V) and the other is LOW (for example, 0 V). The P+ semiconductor regions 73-1 and 73-2 correspond to voltage application units to which the first voltage or the second voltage is applied.

The N+ semiconductor regions 71-1 and 71-2 correspond to charge detection units which detect and accumulate charges generated through photoelectric conversion of light incident on the substrate 61.

If a drive signal TRG supplied to a gate electrode becomes active, the transfer transistor 721A becomes conductive accordingly. As a result, the charges accumulated in the N+ semiconductor region 71-1 are transferred to the FD 722A. If the drive signal TRG supplied to the gate electrode becomes active, the transfer transistor 721B becomes conductive accordingly. As a result, the charges accumulated in the N+ semiconductor region 71-2 are transferred to the FD 722B.

The FD 722A temporarily holds the charges supplied from the N+ semiconductor region 71-1. On the other hand, the FD 722B temporarily holds the charges supplied from the N+ semiconductor region 71-2. The FD 722A corresponds to the FD portion A described in the description of FIG. 2. On the other hand, the FD 722B corresponds to the FD portion B.

If a drive signal RST supplied to the gate electrode becomes active, the reset transistor 723A becomes conductive accordingly. As a result, a potential of the FD 722A is reset to a predetermined level (reset voltage VDD). If the drive signal RST supplied to the gate electrode becomes active, the reset transistor 723B becomes conductive accordingly. As a result, a potential of the FD 722B is reset to a predetermined level (reset voltage VDD). Note that, when the reset transistors 723A and 723B are active, the transfer transistors 721A and 721B can be active.

A source electrode of the amplification transistor 724A is connected to the vertical signal line 29A via the selection transistor 725A. As a result, a load MOS and a source follower circuit of the constant current source circuit unit 726A connected to one end of the vertical signal line 29A are formed. A source electrode of the amplification transistor 724B is connected to the vertical signal line 29B via the selection transistor 725B. As a result, a load MOS and a source follower circuit of the constant current source circuit unit 726B connected to one end of the vertical signal line 29B are formed.

The selection transistor 725A is connected between the source electrode of the amplification transistor 724A and the vertical signal line 29 A. If a selection signal SEL supplied to the gate electrode becomes active, the selection transistor 725A becomes conductive accordingly. As a result, the pixel signal output from the amplification transistor 724A is output to the vertical signal line 29A.

The selection transistor 725B is connected between the source electrode of the amplification transistor 724B and the vertical signal line 29B. If the selection signal SEL supplied to the gate electrode becomes active, the selection transistor 725B becomes conductive accordingly. As a result, the pixel signal output from the amplification transistor 724B is output to the vertical signal line 29B.

The transfer transistors 721A and 721B, the reset transistors 723A and 723B, the amplification transistors 724A and 724B, and the selection transistors 725A and 725B of the pixel 51 are controlled using, for example, the pixel drive unit 22.

Figure 6:
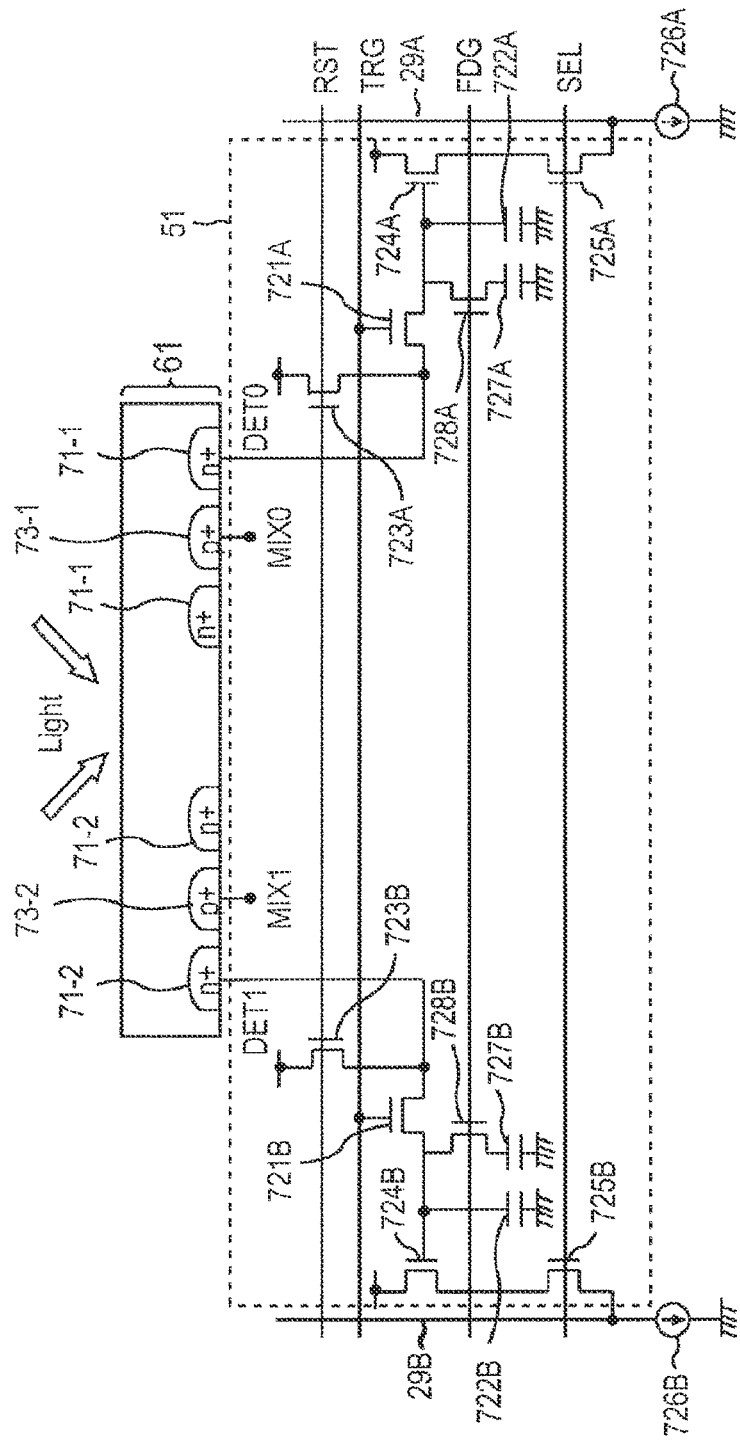
FIG. 6 is a diagram illustrating an example of another equivalent circuit of the pixel.

FIG. 6 illustrates another equivalent circuit of the pixel 51.

In FIG. 6, constituent elements corresponding to those in FIG. 5 are denoted by the same reference numerals. The constituent elements denoted by the same reference numerals will not be described.

The equivalent circuit of FIG. 6 is different from the equivalent circuit of FIG. 5 in that an additional capacitance 727 and a switching transistor 728 for controlling connection thereof are added to each of the signal taking-out units 65-1 and 65-2.

Specifically, the additional capacitance 727A is connected between the transfer transistor 721A and the FD 722A via a switching transistor 728A. Furthermore, an additional capacitance 727B is connected between the transfer transistor 721B and the FD 722B via a switching transistor 728B.

If a drive signal FDG supplied to the gate electrode becomes active, the switching transistor 728A becomes conductive accordingly. As a result, the additional capacitance 727A is connected to the FD 722A. If the drive signal FDG supplied to the gate electrode becomes active, the switching transistor 728B becomes conductive accordingly. As a result, the additional capacitance 727B is connected to the FD 722B.

For example, at the time of high illuminance with a large amount of incident light, the pixel drive unit 22 makes the switching transistors 728A and 728B active and connects the FD 722A and the additional capacitance 727A. Furthermore, the pixel drive unit 22 connects the FD 722B and the additional capacitance 727B. This makes it possible to accumulate more electric charges at the time of high illuminance.

On the other hand, at the time of low illuminance with a small amount of incident light, the pixel drive unit 22 makes the switching transistors 728A and 728B inactive. As a result, the additional capacitances 727A and 727B are cut off from the FDs 722A and 722B, respectively.

As in the example of FIG. 6, a high dynamic range can be secured by installing the additional capacitance 727 and using it properly according to the amount of incident light. Here, as in the equivalent circuit of FIG. 5, a configuration in which the additional capacitance 727 is omitted may be used.

(Example of Configuration of Distance Measuring Module)

Figure 7:
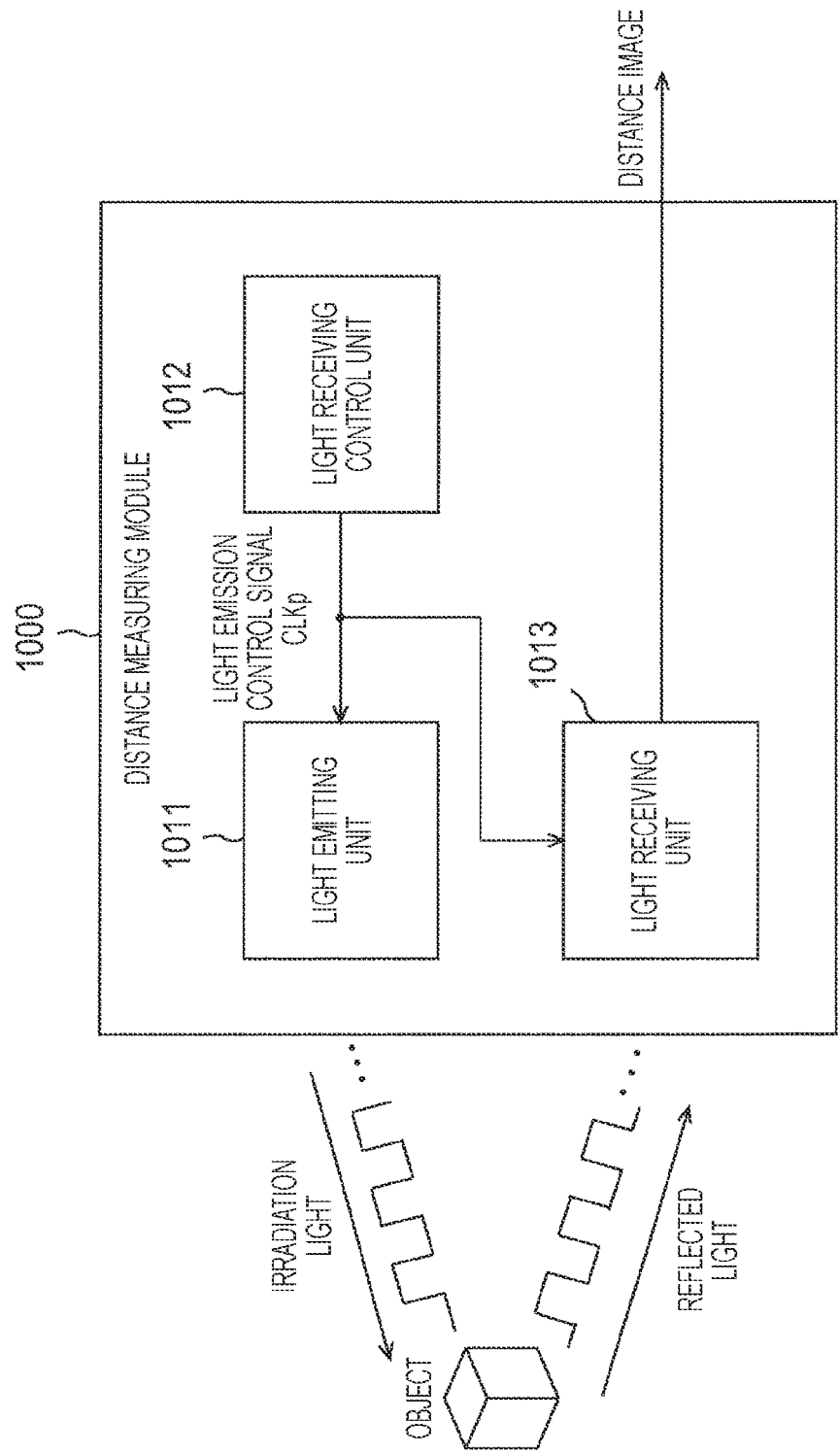
FIG. 7 is a diagram illustrating an example of a configuration of a distance measuring device.

FIG. 7 is a block diagram illustrating an example of a configuration of a distance measuring module which outputs distance measurement information using the imaging element 11 in FIG. 1.

A distance measuring module 1000 includes a light emitting unit 1011, a light emission control unit 1012, and a light receiving unit 1013.

The light emitting unit 1011 has a light source which emits light of a predetermined wavelength and emits irradiation light of which brightness varies periodically to radiate an object. For example, the light emitting unit 1011 includes, as a light source, a light emitting diode which emits infrared light having a wavelength in a range of 780 nm to 1000 nm. The light emitting unit 1011 generates irradiation light in synchronization with, for example, a rectangular wave light emission control signal CLKp supplied from the light emission control unit 1012.

Note that, for example, a periodic signal can be used as the light emission control signal CLKp. The periodic signal is not limited to rectangular waves. For example, the light emission control signal CLKp may be a sine wave.

The light emission control unit 1012 supplies the light emission control signal CLKp to the light emitting unit 1011 and the light receiving unit 1013 to control the irradiation timing of the irradiation light. A frequency of the light emission control signal CLKp is, for example, 20 megahertz (MHz). Note that the frequency of the light emission control signal CLKp is not limited to 20 megahertz (MHz) and may be set to other values such as 5 megahertz (MHz).

The light receiving unit 1013 receives reflected light reflected from an object and calculates distance information for each pixel in accordance with the light reception result. Also, a distance image in which a distance from the object is represented by a gradation value for each pixel is generated and the distance image is output.

As the light receiving unit 1013, for example, the above-described imaging element 11 can be used. In the case in which the imaging element 11 is used as the light receiving unit 1013, distance information can be calculated for each pixel on the basis of a signal intensity detected by a charge detection unit (N+ semiconductor region 71) of each of the signal taking-out units 65-1 and 65-2 of each pixel 51 of the pixel array unit 21 on the basis of the light emission control signal CLKp.

As described above, the imaging element 11 in FIG. 1 can be incorporated as the light receiving unit 1013 of the distance measuring module 1000 which obtains and outputs distance information from a subject through the indirect ToF method. By adopting the above-described imaging element 11 as the light receiving unit 1013 of the distance measuring module 1000, it is possible to prevent the generated electromagnetic noise.

In addition, although an example in which electrons are used as signal carriers has been described above, holes generated through photoelectric conversion may be used as signal carriers. In this case, the charge detection unit for detecting the signal carrier is formed using the P+ semiconductor region. In addition, a voltage application unit for generating an electric field in a substrate is formed by the N+ semiconductor region. In addition, holes as signal carriers may be detected in the charge detection unit provided in the signal taking-out unit.

Figure 8:
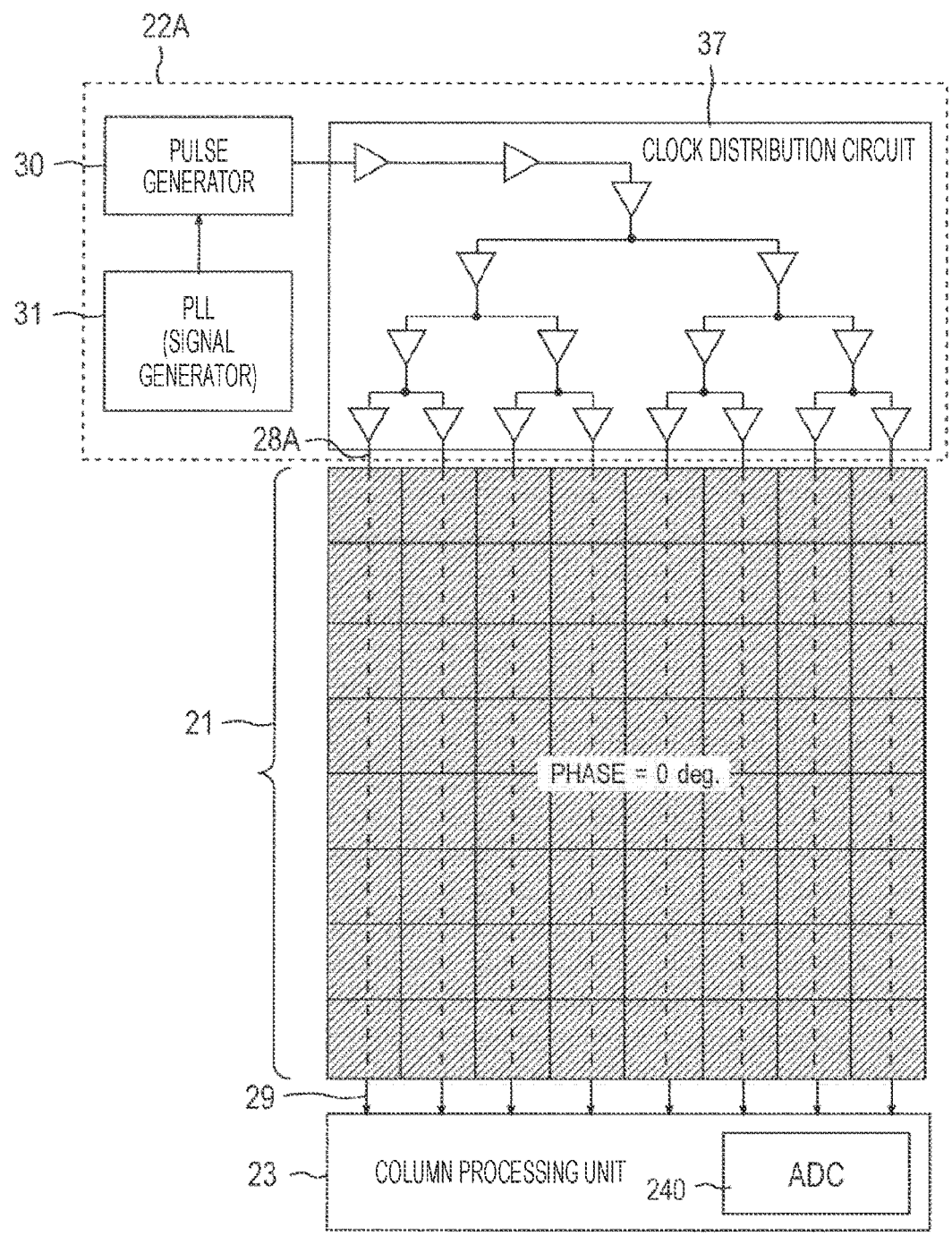
FIG. 8 is a diagram illustrating an example of a case in which all pixels in an imaging element are simultaneously driven.

(Example of configuration of imaging element) FIG. 8 illustrates an example of a case in which all of the pixels in the imaging element are simultaneously driven. FIG. 8 illustrates a portion including the pixel drive unit 22A, the pixel array unit 21, and the column processing unit 23 in FIG. 2 in more detail. The pixel drive unit 22A in FIG. 8 includes a phase locked loop (PLL) 31, a pulse generator 30, and a clock distribution circuit 37. In addition, the column processing unit 23 includes an analog-to-digital converter 240.

The PLL 31 is an example of a signal generator which generates a clock signal. A case in which a PLL is used as the signal generator will be described below as an example. Here, the use of a type of circuit other than the PLL as the signal generator is not hindered. A pulse generator 30 is connected to a subsequent stage of the PLL 31. Furthermore, a clock distribution circuit 37 is connected to a subsequent stage of the pulse generator 30. The clock distribution circuit 37 in FIG. 8 implements signal distribution through a clock tree method. Here, a clock distribution circuit of a mesh method (collective driving method) may be used and the type of the clock distribution circuit is not limited. The clock distribution circuit 37 includes a plurality of output terminals. Each output terminal of the clock distribution circuit 37 is connected to each pixel column in the pixel array unit 21 via a pixel drive line 28A. Furthermore, each pixel column in the pixel array unit 21 is connected to the column processing unit 23 via a vertical signal line 29.

A clock signal having a frequency $f_0$ output from the PLL 31 is supplied to the pulse generator 30. The pulse generator 30 generates pulses at a predetermined cycle on the basis of the clock signal having the frequency $f_0$. A pulse generated by the pulse generator 30 is supplied to each pixel column in the pixel array unit 21 at substantially equal timing via the clock distribution circuit 37.

For this reason, in the imaging element of FIG. 8, all of the pixels in the pixel array unit 21 are driven in one phase (PHASE=0 degrees). In the imaging element of FIG. 8, as the number of pixels in the pixel array unit 21 increases, a total value of drive currents output from the pulse generator 30 in the pixel drive unit 22A increases. Since a change in the current value becomes large, there is a concern concerning that the electromagnetic noise generated at the time of detecting incident light becomes large. Therefore, as will be described later, a pulse generator capable of generating pulses of a plurality of phases can be installed in the pixel drive unit 22 or the pixel drive unit 22A.

Figure 9:
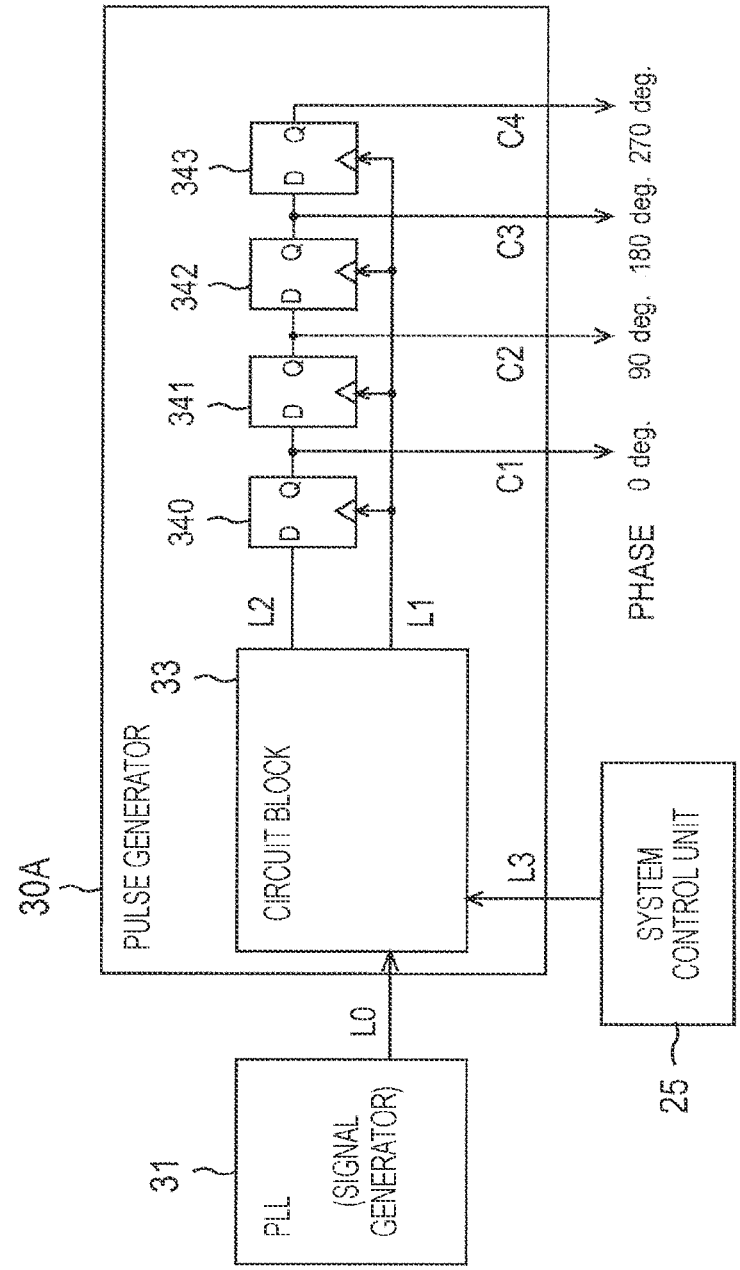
FIG. 9 is a diagram illustrating an example of a pulse generator according to the present disclosure.

FIG. 9 illustrates an example of a pulse generator according to the present disclosure. A pulse generator 30A of FIG. 9 includes a plurality of output terminals (output terminals C1 to C4). The output terminals C1 to C4 are connected to the pixel drive line 28 or the pixel drive line 28A via, for example, a signal distribution circuit or the like which will be described later. As will be described later, the pulse generator 30A can output pulses at different phases from the respective signal lines. The pulse generator 30A includes a circuit block 33 and flip-flops 340 to 343. The flip-flops 340 to 343 are, for example, D flip-flops including a D terminal, a Q terminal, and a CLK terminal. Here, a type of the flip-flop to be used is not limited.

Each of the D flip-flops includes (1) a type in which a signal input to the D terminal is latched at timing of a rising edge of a signal input to the CLK terminal and (2) a type in which a signal input to the D terminal is latched at timing of a falling edge of a signal input to the CLK terminal. As the flip-flops 340 to 343, either the type (1) or the type (2) may be used. In addition, a flip-flop of the type (1) and a flip-flop of the type (2) may be mixed in the flip-flops 340 to 343. By mixing flip-flops of different types, it is possible to shift the timing at which a pulse is output from each of the output terminals C1 to C4.

The circuit block 33 is connected to the PLL 31 via a signal line L0. Furthermore, the circuit block 33 is connected to the system control unit 25 via a signal line L3. The circuit block 33 is connected to a D terminal of the flip-flop 340 via a signal line L2. Furthermore, the circuit block 33 is connected to CLK terminals of the flip-flops 340 to 343 via a signal line L1.

The circuit block 33 includes, for example, a frequency divider circuit. In this case, the frequency divider circuit of the circuit block 33 generates a signal having a frequency different from that of the clock signal on the basis of a clock signal to be input. The setting of the frequency divider circuit of the circuit block 33 may be changeable in accordance with a voltage level or the like of a register or a signal line. In this case, the system control unit 25 can adjust the frequency of the signal output from the circuit block 33. Here, a configuration and a function of the circuit block 33 may be different from those described above. For example, a configuration in which the setting of the circuit block 33 is always changed by the system control unit 25 may not be adopted.

In FIG. 9, a plurality of flip-flops is connected in a cascade manner. For example, a Q terminal of the flip-flop 340 is connected to a D terminal of the flip-flop 341. On the other hand, a Q terminal of the flip-flop 341 is connected to a D terminal of the flip-flop 342. A Q terminal of the flip-flop 342 is connected to a D terminal of the flip-flop 343.

In addition, a Q terminal of each of the flip-flops is connected to a corresponding output terminal. For example, an output terminal C1 is connected to the Q terminal of the flip-flop 340. Furthermore, an output terminal C2 is connected to the Q terminal of the flip-flop 341. An output terminal C3 is connected to the Q terminal of the flip-flop 342. An output terminal C4 is connected to the Q terminal of the flip-flop 343. Here, the Q terminals of all of the flip-flops connected in a cascade manner may not necessarily be connected to any of the output terminals. For example, the Q terminals of some of the flip-flops connected in a cascade manner may be connected to any of the output terminals.

An operation of the pulse generator 30A will be described below.

The PLL 31 supplies the clock signal having the frequency $f_0$ to the circuit block 33 via the signal line L0. The circuit block 33 supplies a first signal having a frequency $f_1$ from the signal line L1 to the CLK terminals of the flip-flops 340 to 343. Furthermore, the circuit block 33 supplies a second signal having a frequency $f_2$ to the D terminal of the flip-flop 340 via the signal line L2. The second signal is also referred to as a "modulation signal or a guide pulse".

It is assumed that a frequency $f_1$ (first frequency) of the first signal and a frequency $f_2$ (second frequency) of the second signal are different. A case in which the first frequency $f_1$ is higher than the second frequency $f_2$ will be described below. Here, the second frequency $f_2$ may be set higher than the first frequency $f_1$. The circuit block 33 can output the first signal and the second signal in synchronization with each other. Here, the first signal and the second signal are not necessarily in synchronization with each other.

Here, a description will be given on the assumption that the frequency $f_0$ (clock frequency) of the clock signal is equal to the first frequency $f_1$. Here, the clock frequency $f_0$ generated by the signal generator and the first frequency $f_1$ may be different. For example, the circuit block 33 may convert the frequency of the clock signal using a frequency divider or the like.

As a result, pulses which have been delayed using a different number of flip-flops are output from the output terminals C1 to C4 of the pulse generator 30A. In the case of the example of FIG. 9, pulses are output through the output terminal C1, the output terminal C2, the output terminal C3, and the output terminal C4 in this order. That is to say, pulses are output from the output terminals C1 to C4 of the pulse generator 30A at different timings. A difference in timing at which a pulse is output from any signal line without a pulse generator will be described below using a phase (PHASE in the drawing).

In the pulse generator according to the present disclosure, it is possible to adjust a shift in timings at which pulses are output from the plurality of output terminals on the basis of the first frequency $f_1$ and the second frequency $f_2$. The phase delay $\Delta\theta$ caused by the second signal passing through a one-stage flip-flop is $\Delta\theta=360\times f_2/f_1$. For example, in the case in which $f_1=2.0$ GHz and $f_2=500$ MHz, $\Delta\theta=90$ degrees is satisfied. In this case, as illustrated in FIG. 9, pulse signals are output from the output terminals C1, C2, C3, and C4 in phases of 0 degrees, 90 degrees, 180 degrees, and 270 degrees, respectively. Values of the first frequency $f_1$ and the second frequency $f_2$ mentioned herein are merely examples. Therefore, the first frequency $f_1$ and the second frequency $f_2$ may be set to values different from those of the first frequency $f_1$ and the second frequency $f_2$.

Hereinafter, a phase of a pulse signal output from the output terminal C1 is P1, a phase of a pulse signal output from the output terminal C2 is P2, a phase of a pulse signal output from the output terminal C3 is P3, and a phase of a pulse signal output from the output terminal C4 is P4. For example, in the case in which $f_1=2.0$ GHz and $f_2=500$ MHz as described above, P1=0 degrees, P2=90 degrees, P3=180 degrees, and P4=270 degrees are satisfied.

Note that the first frequency $f_1$ of the first signal and the second frequency $f_2$ of the second signal may not be fixed. For example, the circuit block 33 may change at least one of the first frequency $f_1$ of the first signal or the second frequency $f_2$ of the second signal on the basis of the control signal transmitted from the system control unit 25 via the signal line L3. As a result, the pulse generator can change the frequency of the pulse signal. Furthermore, the pulse signal can output a pulse signal relating to various combinations of phases.

The pulse generator according to the present disclosure can change a frequency of the pulse signal or a combination of phases used in the pulse signal in accordance with, for example, an object to be detected or an operation mode. For example, in the case in which an object located at a relatively short distance is to be detected, the pulse frequency can be set high. In addition, in the case in which an object located at a relatively long distance is to be detected, the pulse frequency can be set low. Since the pulse generator according to the present disclosure does not use the inverter chain to generate the pulse signals of the plurality of phases, it is possible to minimize individual variations in amount of delay. Furthermore, in the pulse generator according to the present disclosure, the distortion to be generated can be minimized. For this reason, the pulse generator according to the present disclosure can also be combined with a signal generator (for example, PLL 31) which outputs a relatively low clock frequency.

As described above, the circuit block may be configured to output the first signal having the first frequency and output the second signal having the second frequency different from the first frequency. The circuit block may be configured to output the first signal and the second signal in synchronization with each other. Furthermore, the circuit block may be configured to output a first signal having a first frequency equal to a clock frequency of the clock signal.

Furthermore, the imaging element according to the present disclosure may include a control unit configured to output a control signal to a circuit block. The above-described system control unit 25 is an example of a control unit. In this case, the circuit block may be configured to adjust the first frequency of the first signal or the second frequency of the second signal on the basis of the supplied control signal.

Figure 10:
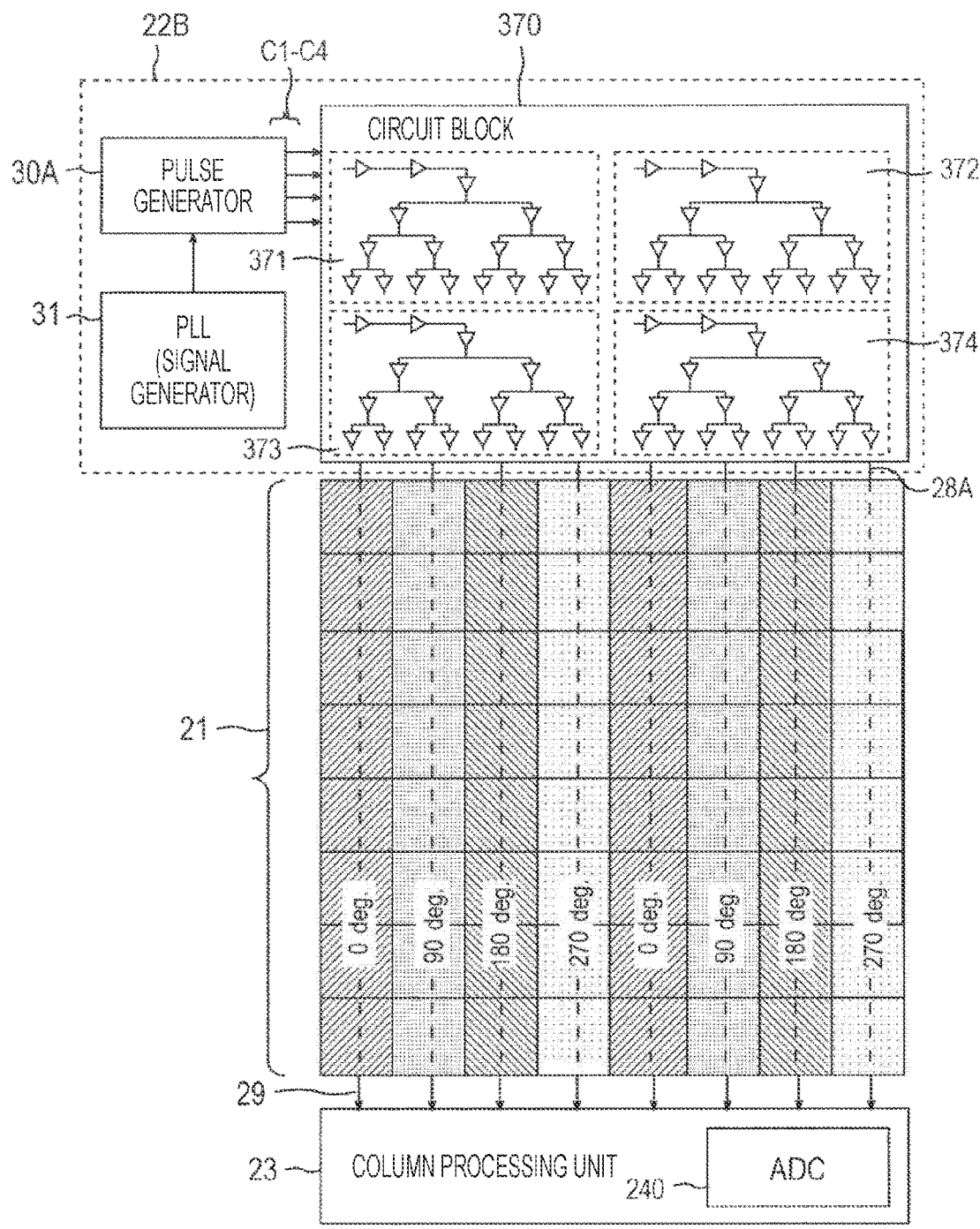
FIG. 10 is a diagram illustrating an example of a case in which pixels in an imaging element are driven for each column.

A pixel drive unit 22B in FIG. 10 includes a PLL 31 (signal generation unit), a pulse generator 30A, and a circuit block 370. An imaging element in FIG. 10 corresponds to an imaging element in which the pulse generator 30 of the imaging element in FIG. 8 is replaced with the pulse generator 30A in FIG. 9 and the clock distribution circuit 37 of the imaging element in FIG. 8 is replaced with a circuit block 370. The circuit block 370 includes clock distribution circuits 371 to 374. The clock distribution circuits 371 to 374 of FIG. 10 are of a clock tree method. Here, at least one of the clock distribution circuits 371 to 374 may use another method such as a mesh method (collective drive method).

Each of the clock distribution circuits 371 to 374 are connected to any one of the output terminals C1 to C4 of the pulse generator 30A. Therefore, each of the clock distribution circuits 371 to 374 distributes any one of the signals of the phases P1 to P4. In the following description, it is assumed that the output terminal C1 is connected to the clock distribution circuit 371, the output terminal C2 is connected to the clock distribution circuit 372, the output terminal C3 is connected to the clock distribution circuit 373, and the output terminal C4 is connected to the clock distribution circuit 374. Here, a connection relationship between the output terminal and the clock distribution circuit may be different from this.

Each pixel column in the pixel array unit 21 is connected to any one of the clock distribution circuits 371 to 374 via a pixel drive line 28A. The timing at which the pixel column in the pixel array unit 21 is driven using the pulse (the phase of the pulse signal) depends on the clock distribution circuit to which the corresponding pixel drive line 28A is connected. In the case of the example of FIG. 10, a pixel column connected to the clock distribution circuit 371 is driven at a phase P1, a pixel column connected to the clock distribution circuit 372 is driven at a phase P2, a pixel column connected to the clock distribution circuit 373 is driven at a phase P3, and a pixel column connected to the clock distribution circuit 374 is driven at a phase P4. Therefore, in the example of FIG. 10, the pixels in the imaging element are driven in units of columns.

In the pixel array unit 21 of FIG. 10, a pixel column driven at the phase P1, a pixel column driven at the phase P2, a pixel column driven at the phase P3, and a pixel column driven at the phase P4 are arranged in a pattern (order) from the left side toward the right side. Here, this pattern is merely an example. For this reason, the pixel column of the pixel array unit 21 may be driven in a pattern different from this. Note that, in FIG. 10, the number of pixels included in the pixel array unit 21 is 8×8=64. Here, the number of pixels included in the pixel array unit 21 is not limited. Therefore, the number of pixels (for example, more pixels) different from this may be installed in the pixel array unit 21.

Each pixel column in the pixel array unit 21 is connected to the column processing unit 23 via the vertical signal line 29. The column processing unit 23 may be connected to a lead drive unit 24 (not illustrated). In the case in which the lead drive unit 24 is installed, the lead drive unit 24 can select a unit circuit corresponding to the pixel column of the column processing unit 23. The lead drive unit 24 may perform selective scanning for a pixel column driven in each phase (for example, P1 to P4). In this case, the column processing unit 23 can convert the pixel signal from an analog signal to a digital signal using the analog-to-digital converter 240 and output the pixel signal to the signal processing unit 26 in the subsequent stage.

Pixel signals relating to pixel columns driven and read in a plurality of phases (for example, P1 to P4) are input to the signal processing unit 26. In the imaging element of FIG. 10, a shift in drive timing and a shift in pixel signal read timing occur depending on the pixel column. For this reason, data of the pixel signal may be accumulated in a buffer memory in the signal processing unit 26 and a distance image corresponding to the entire pixel array unit 21 may be generated.

An imaging element according to the present disclosure may include a signal generator, a plurality of flip-flops connected in a cascade manner, a circuit block, and a pixel array. The signal generator is configured to generate a clock signal. The circuit block is configured to supply a first signal to a clock terminal of each of the plurality of flip-flops in accordance with the clock signal and to supply a second signal to an input terminal of a first-stage flip-flop of the plurality of flip-flops. The pixel array includes pixels configured to be driven using pulse signals supplied from different stages of the plurality of flip-flops. The above-described pixel array unit is an example of a pixel array. As the signal generator, for example, a PLL can be used. As the flip-flop, for example, a D flip-flop can be used. The first-stage flip-flop is, for example, the above-described flip-flop 340.

A pixel in the pixel array may include a signal taking-out unit configured to detect charges generated through photoelectric conversion if a pulse signal is supplied. Furthermore, the pixel in the pixel array may include a plurality of signal taking-out units and each of the signal taking-out units may be configured to detect charges generated at different timings.

Furthermore, the imaging element according to the present disclosure may further include a plurality of clock distribution circuits connected to any stage of the plurality of flip-flops on an input side and connected to the pixels in the pixel array via the drive lines on an output side. At least one of the clock distribution circuits may be of a clock tree method.

FIG. 10 illustrates an example of the imaging element in which the drive timing (the phase of the pulse signal) can be set in units of pixel columns. Here, the pixels in the pixel array unit 21 may be controlled in units and patterns different from these units and patterns. For example, as in the example of FIG. 11, an imaging element in which the drive timing (the phase of the pulse signal) is set in units of pixel rows may be used.

Figure 11:
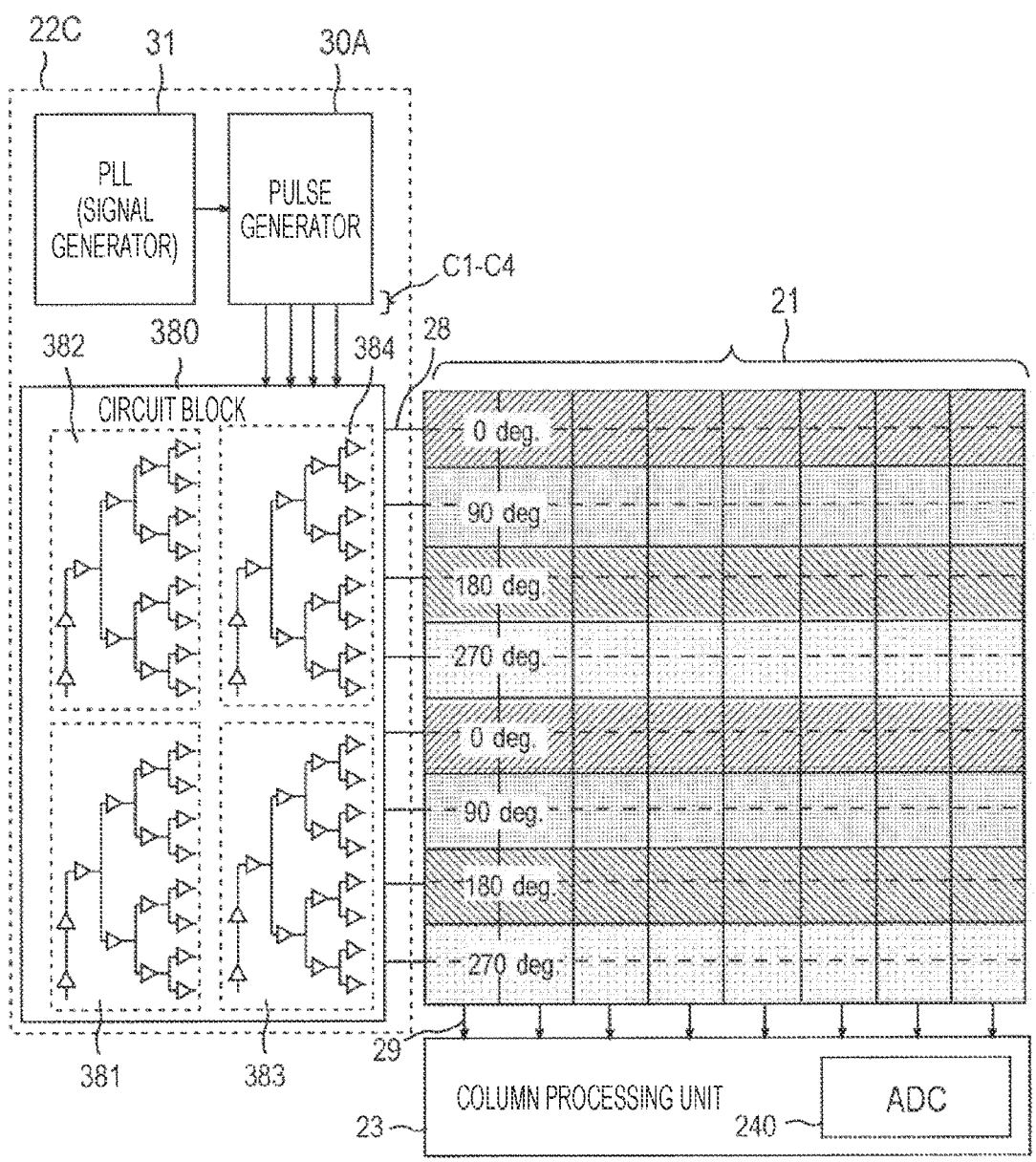
FIG. 11 is a diagram illustrating an example of a case in which pixels in an imaging element are driven for each row.

The imaging element in FIG. 11 corresponds to an imaging element in which the pixel drive unit 22 in FIG. 1 is replaced with a pixel drive unit 22C. The pixel drive unit 22C includes a PLL 31 (signal generator), a pulse generator 30A, and a circuit block 380. In addition, the circuit block 380 includes clock distribution circuits 381 to 384. The clock distribution circuits 381 to 384 of FIG. 11 are of a clock tree method. Here, at least one of the clock distribution circuits 381 to 384 may use another method such as a mesh method (collective drive method).

Each of the clock distribution circuits 381 to 384 is connected to any one of the output terminals C1 to C4 of the pulse generator 30A. Therefore, each of the clock distribution circuits 381 to 384 distributes any one of the signals of the phases P1 to P4. In the following description, it is assumed that the output terminal C1 is connected to the clock distribution circuit 381, the output terminal C2 is connected to the clock distribution circuit 382, the output terminal C3 is connected to the clock distribution circuit 383, and the output terminal C4 is connected to the clock distribution circuit 384. Here, a connection relationship between the output terminal and the clock distribution circuit may be different from this.

Each pixel row in the pixel array unit 21 is connected to any one of the clock distribution circuits 381 to 384 via the pixel drive line 28. The timing at which the pixel row in the pixel array unit 21 is driven using the pulse (the phase of the pulse signal) depends on the clock distribution circuit to which the corresponding pixel drive line 28 is connected. In the case of the example of FIG. 11, a pixel row connected to the clock distribution circuit 381 is driven at a phase P1, a pixel row connected to the clock distribution circuit 382 is driven at a phase P2, a pixel row connected to the clock distribution circuit 383 is driven at a phase P3, and a pixel row connected to the clock distribution circuit 384 is driven at a phase P4. Therefore, in the example of FIG. 11, the pixels in the imaging element are driven in units of rows.

In the pixel array unit 21 of FIG. 11, a pixel row driven at the phase P1, a pixel row driven at the phase P2, a pixel row driven at the phase P3, and a pixel row driven at the phase P4 are arranged in a pattern (order) from the upper side toward the lower side. This pattern is merely an example. For this reason, the pixel rows of the pixel array unit 21 may be driven in a pattern different from this pattern. Note that, in FIG. 11, the number of pixels included in the pixel array unit 21 is 8×8=64. Here, the number of pixels included in the pixel array unit 21 is not limited. Therefore, the number of pixels (for example, more pixels) different from this may be installed in the pixel array unit 21.

Each pixel column in the pixel array unit 21 is connected to the column processing unit 23 via the vertical signal line 29. The column processing unit 23 may be connected to a lead drive unit 24 (not illustrated). In the case in which the lead drive unit 24 is installed, the lead drive unit 24 can select a unit circuit corresponding to the pixel column of the column processing unit 23. The lead drive unit 24 may perform selective scanning on the pixel column. In this case, the column processing unit 23 can convert the pixel signal from an analog signal to a digital signal using the analog-to-digital converter 240 and output the pixel signal to the signal processing unit 26 in the subsequent stage.

The pixel signal relating to the read pixel column is input to the signal processing unit 26. In the imaging element in FIG. 10, a shift in drive timing occurs depending on a pixel row and a shift in pixel signal read timing occurs depending on a pixel column. For this reason, data of the pixel signal may be accumulated in a buffer memory in the signal processing unit 26 and a distance image corresponding to the entire pixel array unit 21 may be generated.

As described above, in the imaging element according to the present disclosure, the pixel column or the pixel row in the pixel array may be configured to be driven using the pulse signal supplied from the common stage of the plurality of flip-flops.

In FIG. 11, an example of the imaging element in which the drive timing (the phase of the pulse signal) is set in units of pixel rows has been described. Here, the pixels in the pixel array unit 21 may be controlled in units and patterns different from these units and patterns. For example, as in the example of FIG. 12, an imaging element in which the drive timing (the phase of the pulse signal) is set for each region in the pixel array unit 21 may be used.

Figure 12:
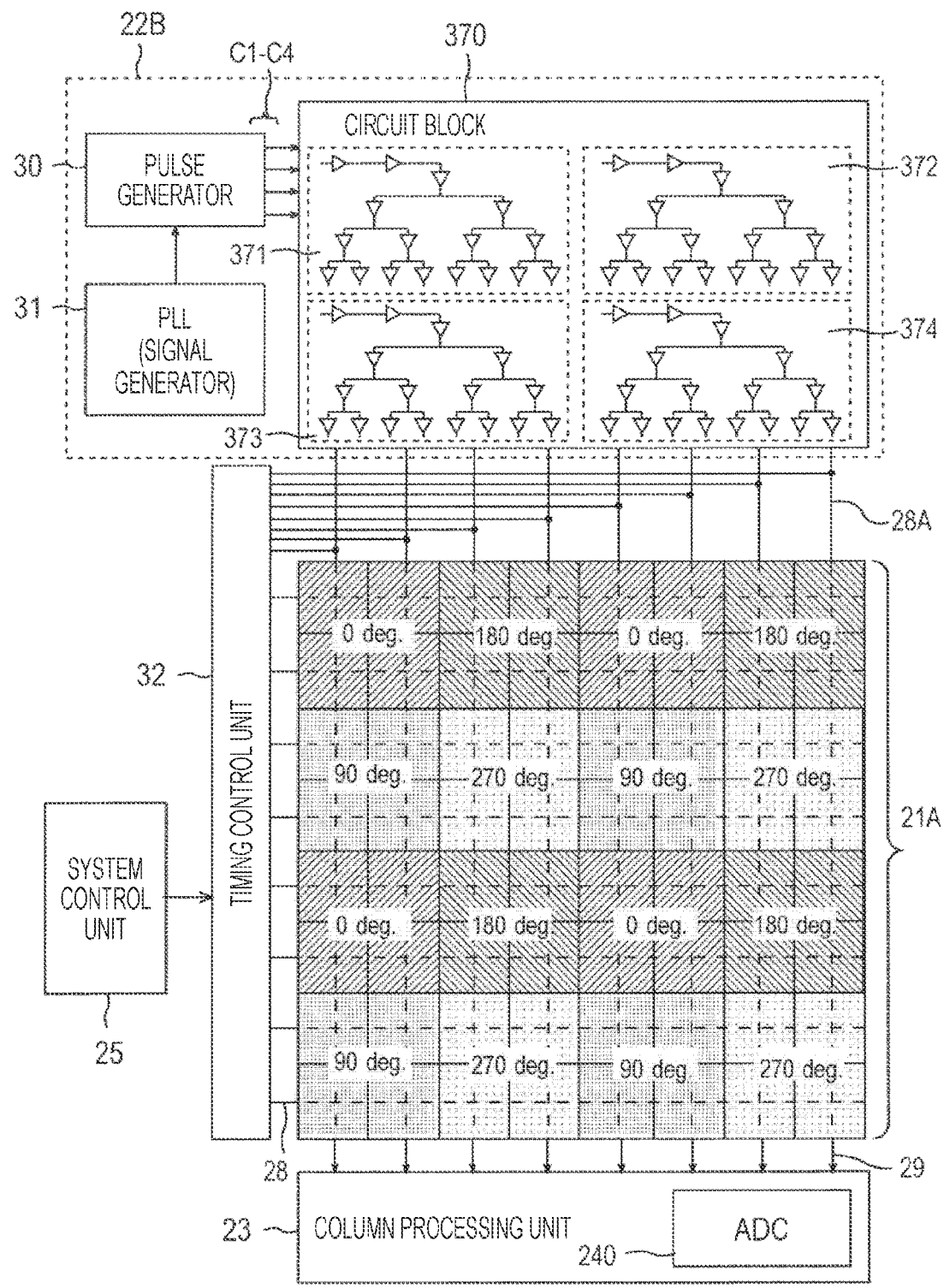
FIG. 12 is a diagram illustrating an example of a case in which pixels in an imaging element are driven for each region.

The imaging element in FIG. 12 includes a pixel drive unit 22B, a pixel array unit 21A, a column processing unit 23, and a timing control unit 32. A configuration of the pixel drive unit 22B in FIG. 12 is similar to that of the pixel drive unit 22B in FIG. 10. The timing control unit 32 outputs a timing signal to the pixel drive line 28 on the basis of the pulse signal output to the pixel drive line 28A by the clock distribution circuits 371 to 374.

For example, it is assumed that each pixel in the pixel array unit 21A includes a logic circuit (not illustrated) which performs calculation on the basis of a pulse signal and a timing signal. Each pixel in the pixel array unit 21A is driven when a level of an output voltage of the logic circuit satisfies a predetermined condition. The driving condition may be different depending on the pixel. For example, in the pixel array unit 21A, a pixel to be driven when the level of the output voltage of the logic circuit is HIGH and a pixel to be driven when the level of the output voltage of the logic circuit is LOW may be mixed. A configuration of the pixel array unit 21A is similar to that of the above-described pixel array unit 21 except that each pixel includes a logic circuit.

Thus, as illustrated in the example of FIG. 12, the drive timing (the phase of the pulse signal) can be set for each region of the pixels in the imaging element. In the example of FIG. 12, any one of the phases P1 to P4 is periodically assigned to each square region. Here, the assigning pattern in FIG. 12 is merely an example. For example, the drive timing (phase of the pulse signal) may be set for each region having another shape such as a polygonal shape or a ring shape. In addition, the order of assigning the phases to the respective regions is not particularly limited. The phase assignment order may be on the basis of a predetermined rule or may be random.

As illustrated in FIG. 12, the timing control unit 32 may be connected to the system control unit 25. In this case, the timing control unit 32 may change the timing signal to be output to the pixel drive line 28 on the basis of the control signal supplied from the system control unit 25. As a result, it is possible to dynamically change the drive timing (the phase of the pulse signal) in each region in the pixel array unit 21A.

In the imaging element of FIG. 12, the configurations of the column processing unit 23 and circuits at a subsequent stage thereof are similar to those of the imaging elements of FIGS. 10 and 11. Note that FIG. 12 is merely an example of the imaging element in which the drive timing (the phase of the pulse signal) can be set for each region. Therefore, the drive timing of the pixel (the phase of the pulse signal) may be set for each region using a circuit having a configuration different from this.

As described above, the imaging element according to the present disclosure may be configured such that pulse signals are supplied from different stages of the plurality of flip-flops depending on the region in the pixel array in which the pixels are disposed.

FIG. 9 illustrates a pulse generator 30A capable of generating pulses at four phases (phases P1 to P4). Here, the pulse generator 30A in FIG. 9 is merely an example of an imaging element which can be used in the imaging element according to the present disclosure. For example, a pulse generator 30B of FIG. 13 may be used instead of the pulse generator 30A of FIG. 9.

Figure 13:
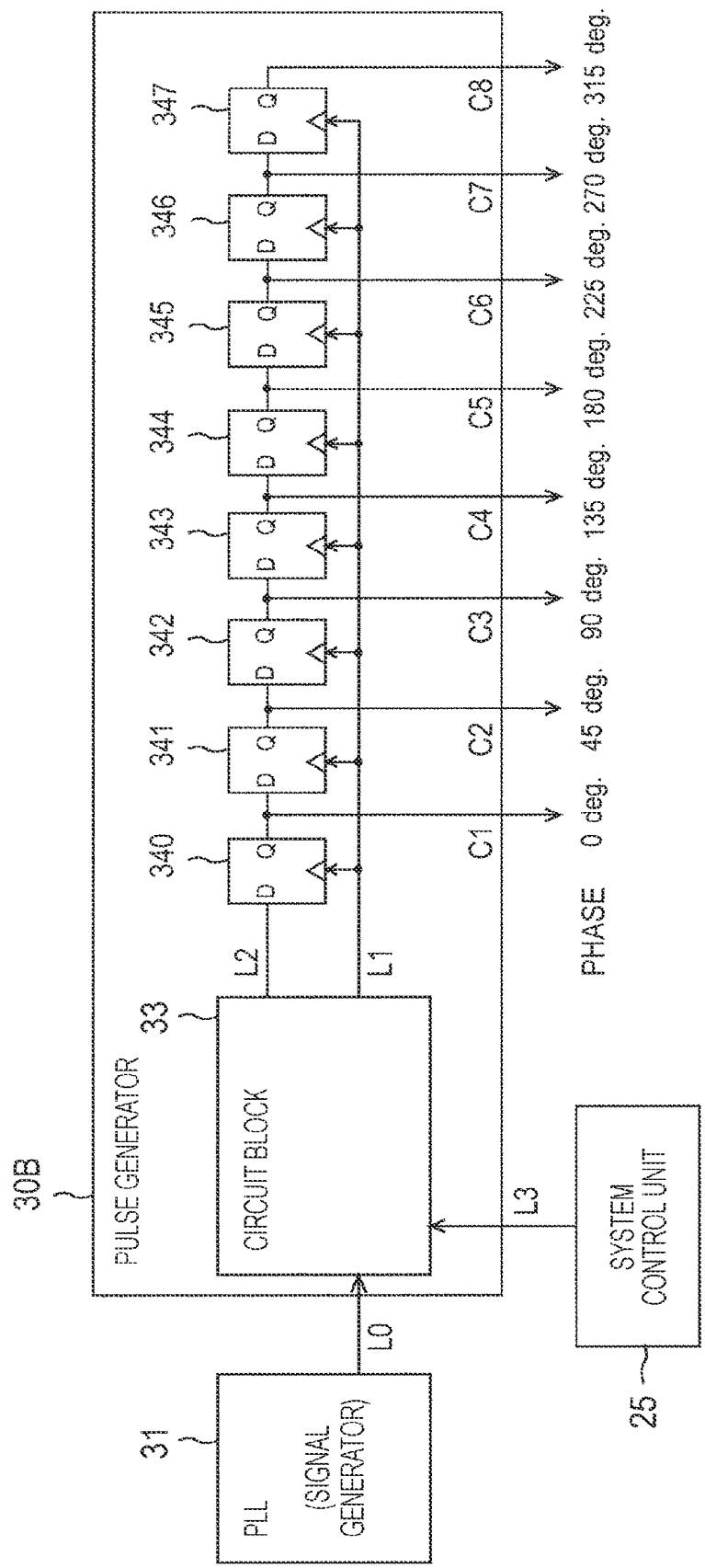
FIG. 13 is a diagram illustrating an example of a pulse generator according to Modification 1.

The pulse generator 30B in FIG. 13 corresponds to a pulse generator in which the number of the stages of flip-flops connected in a cascade manner of the pulse generator 30A in FIG. 9 is increased from 4 to 8. Here, the pulse generator 30B will be described focusing on a difference between the pulse generator 30B and the pulse generator 30A. As in FIG. 9, the Q terminal of the flip-flop 340 is connected to the circuit block 33 via a signal line L2. Furthermore, the Q terminals and the D terminals of the flip-flops which are connected in a cascade manner to each other are connected. Furthermore, the circuit block 33 is connected to the CLK terminals of the flip-flops 340 to 347 via a signal line L1. The Q terminal of each flip-flop in the pulse generator 30B is connected to the corresponding output terminal (output terminals C1 to C8). The output terminals C1 to C8 are each connected to the pixel drive line 28 or the pixel drive line 28A via different clock distribution circuits.

Note that, in the examples of FIGS. 9 and 13, the Q terminals of all of the flip-flops connected in a cascade manner in the pulse generator are connected to any one of the output terminals. Here, the Q terminals of all the flip-flops connected in a cascade manner may not necessarily be connected to any of the output terminals. For example, in the case in which only a part of the phase of the generated pulse signal is required, the Q terminal of some flip-flops among the flip-flops connected in a cascade manner may be connected to the output terminal.

An operation of the pulse generator 30B is similar to that of the pulse generator 30A described above except that the number of phases of the pulse signal to be generated increases. That is to say, on the basis of the first frequency f1 of the first signal output from the circuit block 33 to the signal line L1 and the first frequency f2 of the second signal output from the circuit block 33 to the signal line L2, it is possible to adjust a shift in the timings at which the pulses are output from the plurality of output terminals. As in FIG. 9, the phase delay $\Delta\theta$ caused by the second signal passing through one-stage flip-flop is $\Delta\theta=360\times f2/f1$. Similarly to the above description, it is assumed that the phases of the pulse signals output from the output terminals C1 to C8 are P1 to P8, respectively.

For example, in the case in which $f_{1=2.0}$ GHz and $f_{2=250}$ MHz, A0=45 degrees is satisfied. In this case, as illustrated in FIG. 13, pulses are output from the output terminals C1, C2, C3, C4, C5, C6, C7, and C8 in phases of 0 degrees, 45 degrees, 90 degrees, 135 degrees, 180 degrees, 225 degrees, 270 degrees, and 315 degrees, respectively. That is to say, in the pulse generator 30B, the phase of the pulse signal is P1=0 degrees, P2=45 degrees, P3=90 degrees, P4=135 degrees, P5=180 degrees, P6=225 degrees, P7=270 degrees, and P8=315 degrees. The values of the first frequency f1 and the second frequency f2 mentioned herein are merely examples. Therefore, the first frequency f1 and the second frequency f2 may be set to values different from those of the first frequency f1 and the second frequency f2.

Note that, other constituent elements in FIG. 13 (pulse generator 30B) are similar to those in FIG. 9. The imaging element according to the present disclosure may include a pulse generator capable of generating pulses at a plurality of (two or more) phases (timings). Therefore, the number of stages of flip-flops in the pulse generator can be set to any number of two or more.

The pulse generator in FIGS. 9 and 13 includes a plurality of output terminals and is configured such that pulse signals having different phases are output from the respective output terminals. Here, the pulse generator according to the present disclosure may be configured to output any one of the pulse signals of a plurality of phases.

Figure 14:
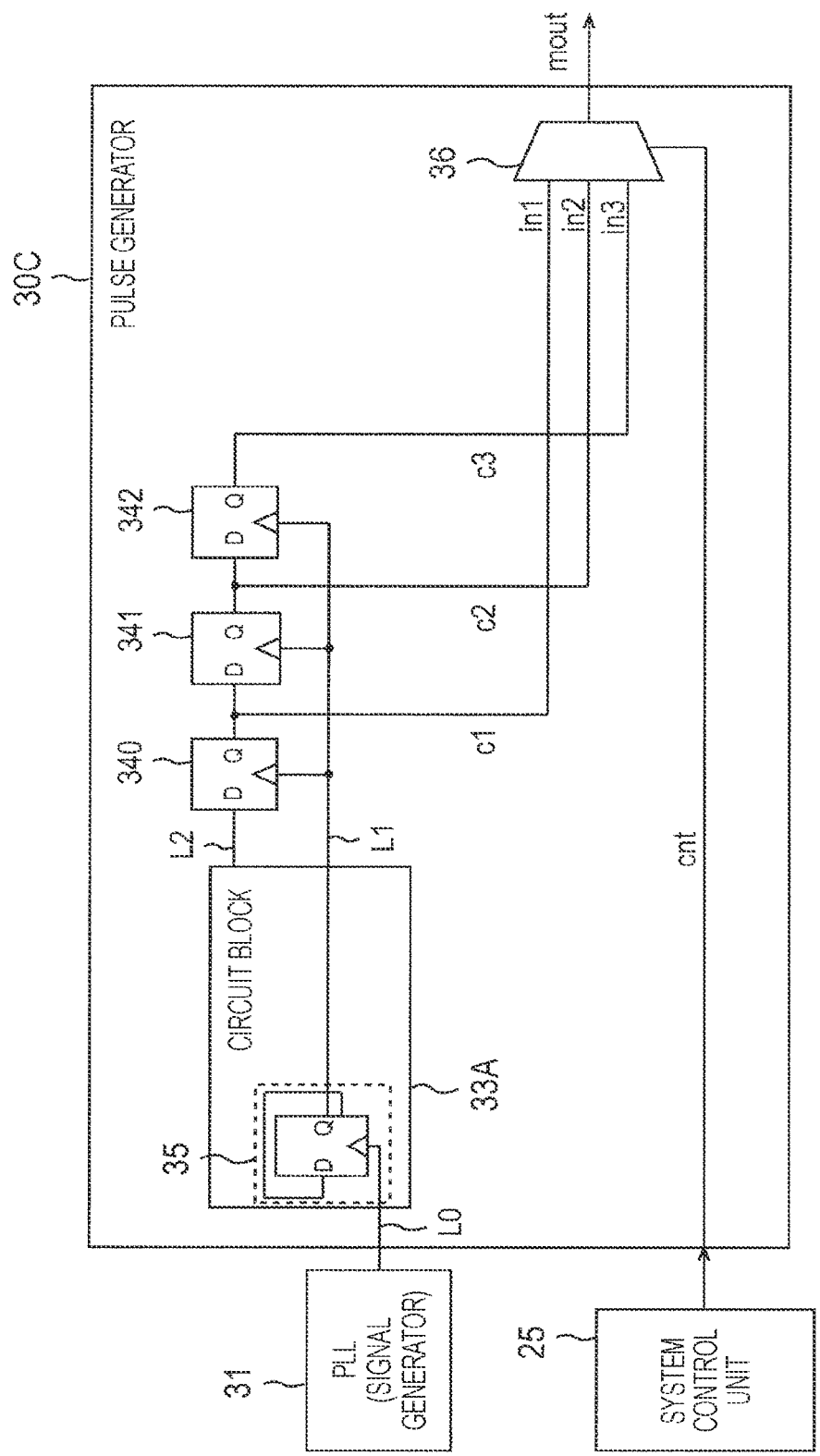
FIG. 14 is a diagram illustrating an example of a pulse generator according to Modification 2.

FIG. 14 illustrates a pulse generator 30C in which the number of stages of flip-flops is 3 and a multiplexer 36 is further installed. The pulse generator 30C of FIG. 14 will be described below focusing on differences between the pulse generator 30C of FIG. 14 and those of FIGS. 9 and 13.

The multiplexer 36 includes input terminals in1 to in3. In the pulse generator 30C, the Q terminal of each flip-flop is connected to the input terminal of the multiplexer 36. That is to say, the Q terminal of the flip-flop 340 is connected to the input terminal in1 of the multiplexer 36 via a signal line c1. The Q terminal of the flip-flop 341 is connected to the input terminal in1 of the multiplexer 36 via a signal line c2. Note that, only the Q terminals of some flip-flops of the plurality of flip-flops connected in a cascade manner may be connected to the input terminal of the multiplexer 36.

The Q terminal of the flip-flop 342 is connected to the input terminal in3 of the multiplexer 36 via a signal line c3. A control terminal of the multiplexer 36 is connected to the system control unit 25 via a signal line cnt. Furthermore, an output terminal mout of the multiplexer 36 is connected to an output terminal of the pulse generator 30C.

The multiplexer 36 selects the signal supplied from the Q terminal of any one of the flip-flops on the basis of the control signal supplied from the system control unit 25. Also, the multiplexer 36 outputs the selected signal from the output terminal mout to a circuit at a subsequent stage. That is to say, the pulse generator 30C can output the pulse signal of any one of the phases P1 to P3 in accordance with the setting using the system control unit 25. Also in FIG. 14, the above equation regarding the phase delay $\Delta\theta$ is established.

The circuit block 33A of the pulse generator 30C includes a frequency divider circuit 35. The frequency divider circuit 35 is, for example, a single frequency divider circuit. Here, the frequency division number of the frequency divider circuit may be different from this. The frequency division number of the frequency divider circuit can be determined in accordance with the clock frequency $f_0$ and the first frequency $f_1$ of the first signal to be generated. An input side of the frequency divider circuit 35 is connected to the PLL 31 via a signal line L0. Furthermore, an output side of the frequency divider circuit 35 is connected to the CLK terminals of the flip-flops 340 to 342 via a signal line L1.

For this reason, the first signal having the first frequency $f_1$ that is ½ of the clock frequency $f_0$ is supplied to the CLK terminals of the flip-flops 340 to 342 via the signal line L1. For example, in the case in which the clock frequency $f_0$ generated by the PLL 31 is 1.6 GHz, the first frequency $f_1$ of the first signal is 800 MHz. In the case in which the second frequency $f_2$ of the second signal output from the signal line L2 by the circuit block 33A is 100 MHz, the phase delay $\Delta\theta$ caused by the second signal passing through the one-stage flip-flop is $\Delta\theta$=45 degrees. Therefore, assuming that the phase P1 is 0 degrees, the phase P2 is 45 degrees and the phase P3 is 90 degrees. Note that the circuit block 33A may generate a second signal synchronized with the first signal.

The clock frequency $f_0$, the first frequency $f_1$, and the second frequency $f_2$ mentioned herein are merely examples. Therefore, a signal of a frequency different from these frequencies may be used in the pulse generator according to the present disclosure. Furthermore, as described above, the first frequency $f_1$ of the first signal and the second frequency $f_2$ of the second signal generated by the circuit block may not be fixed frequencies but may be adjustable (variable) frequencies.

In this manner, the imaging element according to the present disclosure may further include a multiplexer configured to select a pulse signal supplied to a pixel in the pixel array. In addition, the circuit block may further include a frequency divider circuit which generates the first signal on the basis of the clock signal.

Although the number of stages of flip-flops is 3 in the example of FIG. 14, the number of stages of flip-flops may be different from 3. For example, it is possible to generate pulse signals relating to a plurality of phases by connecting two or more arbitrary number of flip-flops in a cascade manner. In the case in which the number of stages of flip-flops is larger than that in the example of FIG. 14, a multiplexer having three or more input terminals may be used or a plurality of multiplexers may be installed in the pulse generator.

Figure 15:
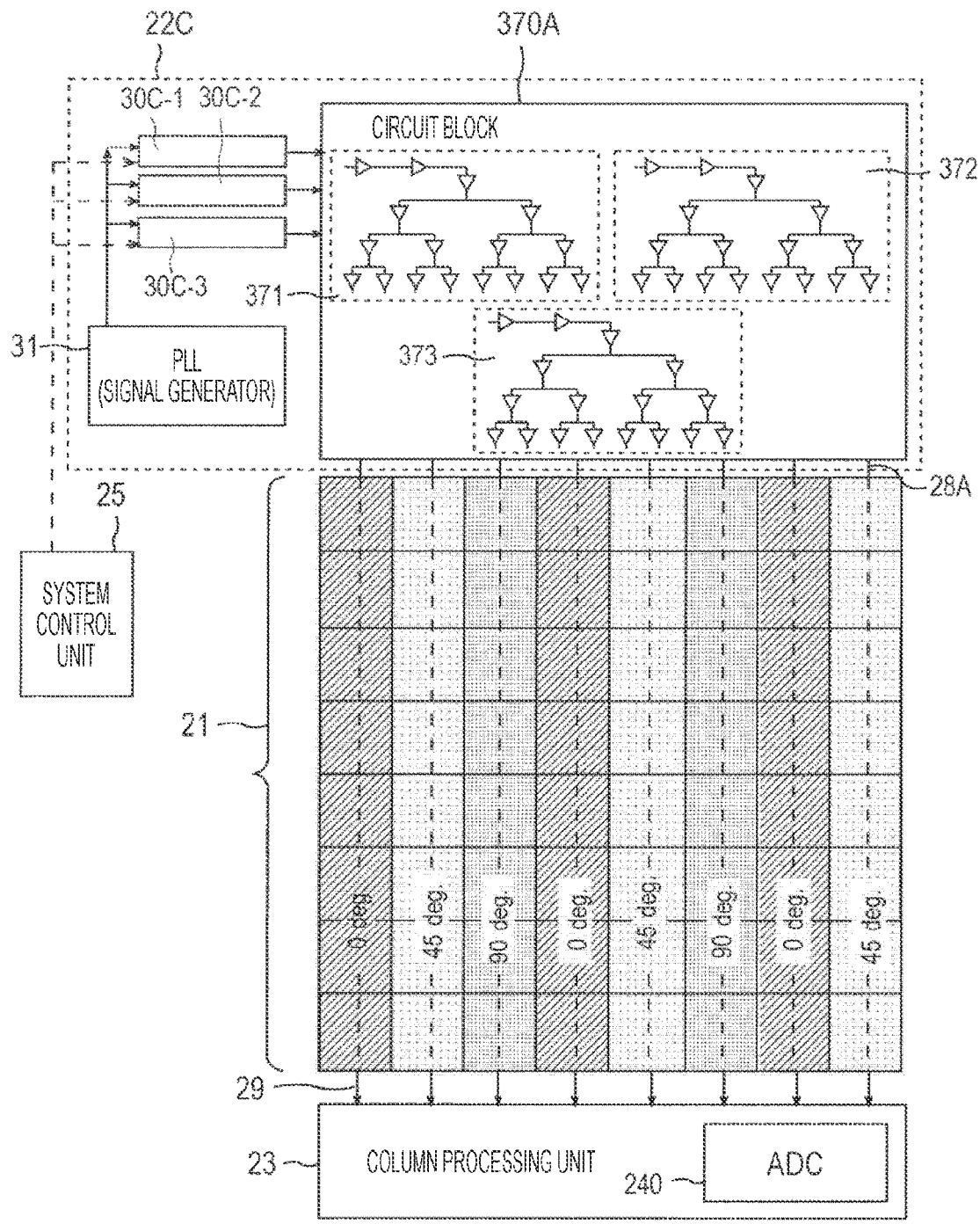
FIG. 15 is a diagram illustrating an example of a configuration of an imaging element according to Modification 2.

FIG. 15 illustrates an example of an imaging element including a plurality of pulse generators 30C of FIG. 14. In FIG. 15, a system control unit 25, a pixel drive unit 22C, a pixel array unit 21, and a column processing unit 23 are provided. The pixel drive unit 22C includes a PLL 31 (signal generator), a pulse generator 30C-1, a pulse generator 30C-2, a pulse generator 30C-3, and a circuit block 370A. The pulse generators 30C-1, 30C-2, and 30C-3 correspond to the pulse generator 30C of FIG. 14. Furthermore, the circuit block 370A includes clock distribution circuits 371 to 373. Although the clock distribution circuits 371 to 373 are, for example, a circuit of a clock tree method, the method of the clock distribution circuit is not limited.

The PLL 31 is connected to the signal line L0 of the pulse generators 30C-1, 30C-2, and 30C-3. Output terminals of the pulse generators 30C-1, 30C-2, and 30C-3 are connected to any clock distribution circuit in the circuit block 370A. Furthermore, each pixel column in the pixel array unit 21 is connected to any one of the clock distribution circuits 371 to 373 via a pixel drive line 28A. Also, each pixel column in the pixel array unit 21 is connected to the column processing unit 23 via the vertical signal line 29.

In the example of FIG. 15, it is assumed that the pulse generator 30C-1 outputs a pulse signal having a phase P1=0 degrees, the pulse generator 30C-2 outputs a pulse signal having a phase P2=45 degrees, and the pulse generator 30C-3 outputs a pulse signal having a phase P3=90 degrees. For this reason, the pixel column in the pixel array unit 21 connected to the pulse generator 30C-1 via any one of the clock distribution circuits is driven using the pulse signal of the phase P1. On the other hand, the pixel column in the pixel array unit 21 connected to the pulse generator 30C-2 via any one of the clock distribution circuits is driven using the pulse signal of the phase P2. Furthermore, the pixel column in the pixel array unit 21 connected to the pulse generator 30C-3 via any one of the clock distribution circuits is driven using the pulse signal of the phase P3.

By using the imaging element of FIG. 15, it is possible to dynamically change the timing at which each pixel column in the pixel array unit 21 is driven. That is to say, In the imaging element of FIG. 15, the pixel column in the pixel array unit 21 can be driven using at least one of the pulse signals of the phases which can be generated by the respective pulse generators. For this reason, it is also possible to drive all of the pixels of the pixel array unit 21 at almost the same timing as in the example of FIG. 8 in accordance with use. Furthermore, the number of phases used for driving the pixels in the pixel array unit 21 can be changed during the operation of the imaging element.

In the imaging element of FIG. 15, the drive timing (the phase of the pulse signal) can be set in units of pixel columns in the pixel array unit 21. Here, the setting unit of the drive timing (the phase of the pulse signal) is not limited to the pixel column. For example, as in the example of FIG. 11, the drive timing (the phase of the pulse signal) may be set in units of pixel rows. Furthermore, as in the example of FIG. 12, the drive timing (phase of the pulse signal) may be set for each region in the pixel array unit 21.

As described above, if the imaging element according to the present disclosure is used, it is possible to drive the pixels in the pixel array separately at a plurality of timings without simultaneously driving all the pixels in the pixel array at the same timing. As a result, a total current of the drive signals at each drive timing can be minimized. For this reason, it is possible to improve the resolution of the distance image while preventing the generation of the electromagnetic noise.

(Example of Configuration of Electronic Device)

Figure 16:
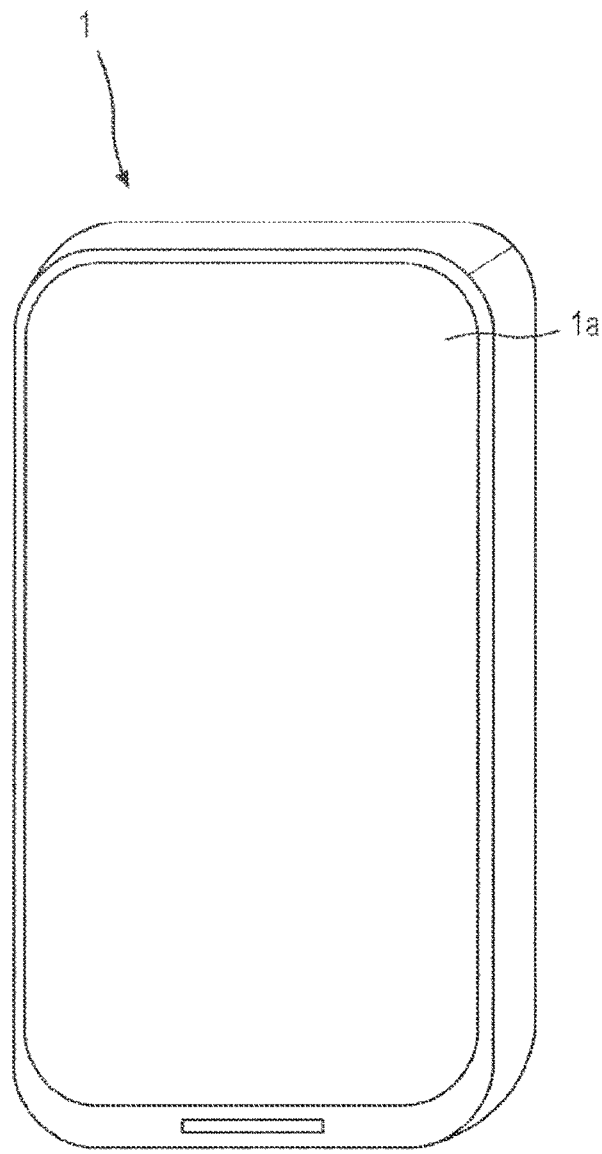
FIG. 16 is a diagram illustrating an example of an electronic device according to the present disclosure.
Figure 17:
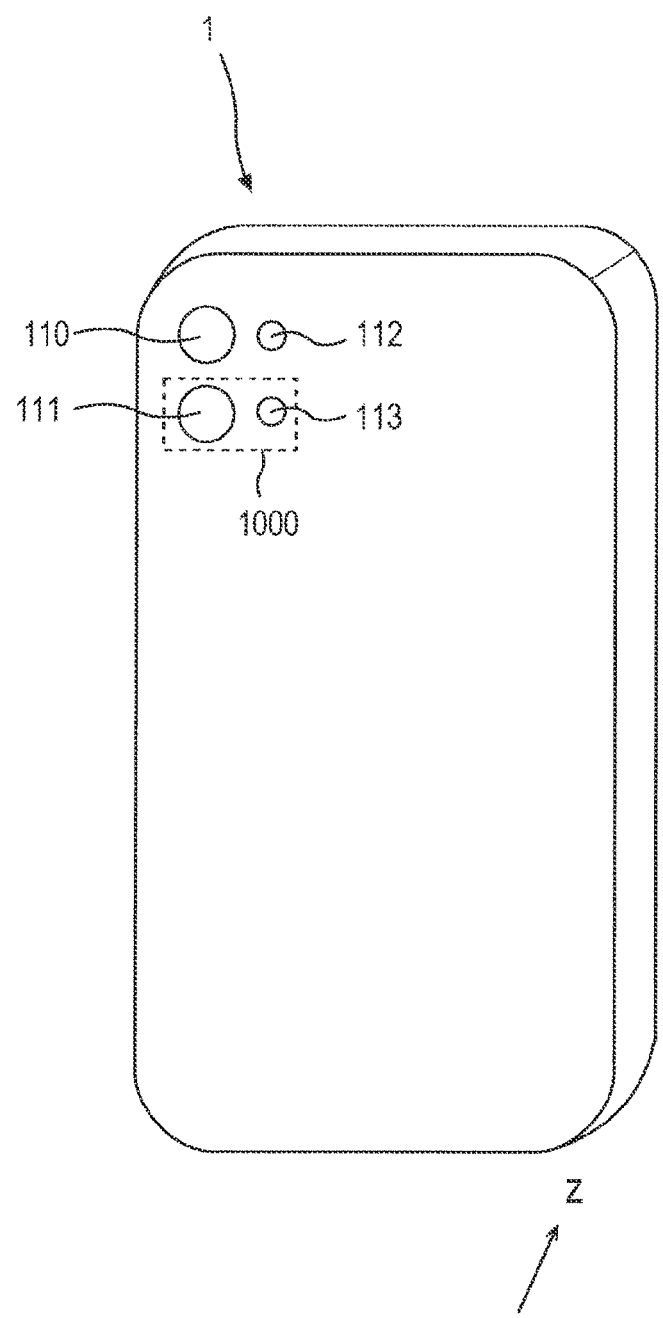
FIG. 17 is a diagram illustrating an example of an electronic device according to the present disclosure.

FIGS. 16 and 17 illustrate examples of electronic devices according to the present disclosure. FIG. 16 illustrates a configuration of an electronic device 1 when viewed from the z-axis positive direction side. On the other hand, FIG. 17 illustrates a configuration of the electronic device 1 when viewed from the z-axis negative direction side. The electronic device 1 has, for example, a substantially flat plate shape, and includes a display unit 1a on at least one surface (here, the surface on the z-axis positive direction side). A display unit 1a can display an image of, for example, a liquid crystal, micro LED, or organic electroluminescence method. Here, the display method in the display unit 1a is not limited. In addition, the display unit 1a may include a touch panel and a fingerprint sensor.

A first imaging unit 110, a second imaging unit 111, a first light emitting unit 112, and a second light emitting unit 113 are installed on a surface of the electronic device 1 on the z-axis negative direction side. The first imaging unit 110 is, for example, a camera module capable of capturing a color image. The camera module includes, for example, a lens system and an imaging element which performs photoelectric conversion of light condensed by the lens system. The first light emitting unit 112 is, for example, a light source used as a flash of the first imaging unit 110. As the first light emitting unit 112, for example, a white LED can be used. Here, a type of the light source used as the first light emitting unit 112 is not limited.

The second imaging unit 111 is, for example, an imaging element capable of distance measurement through the indirect ToF method. For example, the imaging element according to the present disclosure can be installed as the second imaging unit 111. The second imaging unit 111 corresponds to, for example, the light receiving unit 1013 in FIG. 7. The second light emitting unit 113 can be used for distance measurement through the indirect ToF method and is a light source. The second light emitting unit 113 corresponds to, for example, the light emitting unit 1011 in FIG. 7. That is to say, the distance measuring module 1000 in FIG. 7 may be installed in the electronic device 1. The electronic device 1 can perform various processes on the basis of the distance image output from the distance measuring module 1000.

A case in which the electronic device according to the present disclosure is a smartphone or a tablet has been described above. Here, the electronic device according to the present disclosure may be, for example, other types of devices such as a game machine, an in-vehicle device, a PC, and a monitoring camera.

The distance measuring device according to the present disclosure may include a signal generator, a plurality of flip-flops connected in a cascade manner, a circuit block, a pixel array, and a signal processing unit. The signal generator is configured to generate a clock signal. The circuit block is configured to supply a first signal to a clock terminal of each of the plurality of flip-flops in accordance with the clock signal and to supply a second signal to an input terminal of a first-stage flip-flop of the plurality of flip-flops. The pixel array includes pixels configured to be driven using pulse signals supplied from different stages of the plurality of flip-flops. The signal processing unit is configured to generate a distance image on the basis of the charges generated through photoelectric conversion in a pixel of the pixel array.

The electronic device according to the present disclosure may include a signal generator, a plurality of flip-flops connected in a cascade manner, a circuit block, and a pixel array. The signal generator is configured to generate a clock signal. The circuit block is configured to supply a first signal to a clock terminal of each of the plurality of flip-flops in accordance with the clock signal and to supply a second signal to an input terminal of a first-stage flip-flop of the plurality of flip-flops. The pixel array includes pixels configured to be driven using pulse signals supplied from different stages of the plurality of flip-flops.

(Application Example to Mobile Body)

The technique according to the present disclosure (present technique) can be applied to various products. For example, the technique according to the present disclosure may be realized as a device installed in any type of mobile body such as an automobile, an electric vehicle, a hybrid electric vehicle, a motorcycle, a bicycle, a personal mobility, an airplane, a drone, a ship, and a robot.

Figure 18:
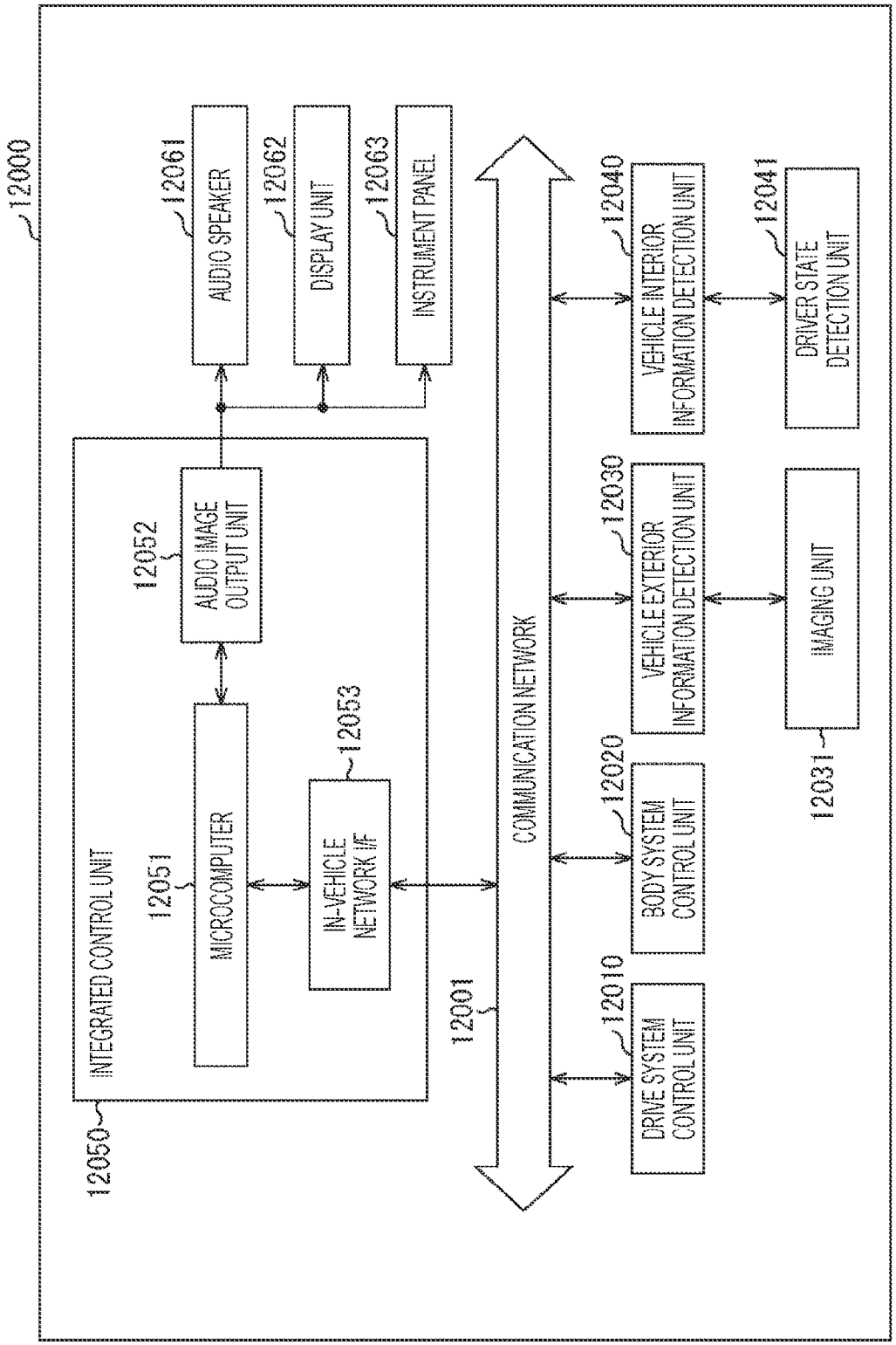
FIG. 18 is a block diagram illustrating an example of a schematic configuration of a vehicle control system.

FIG. 18 is a block diagram illustrating an example of a schematic configuration of a vehicle control system that is an example of a moving body control system to which the technique according to the present disclosure can be applied.

A vehicle control system 12000 includes a plurality of electronic control units connected over a communication network 12001. In the example illustrated in FIG. 18, the vehicle control system 12000 includes a drive system control unit 12010, a body system control unit 12020, a vehicle exterior information detection unit 12030, a vehicle interior information detection unit 12040, and an integrated control unit 12050. Furthermore, as a functional configuration of the integrated control unit 12050, a microcomputer 12051, an audio image output unit 12052, and an in-vehicle network interface (I/F) 12053 are illustrated.

The drive system control unit 12010 controls operations of devices relating to the drive system of the vehicle in accordance with various programs. For example, the drive system control unit 12010 functions as a control device for a driving force generation device for generating a driving force of the vehicle such as an internal combustion engine or a driving motor, a driving force transmission mechanism for transmitting a driving force to wheels, a steering mechanism for adjusting a steering angle of the vehicle, a braking device for generating a braking force of the vehicle, and the like.

The body system control unit 12020 controls operations of various devices installed in the vehicle body in accordance with various programs. For example, the body system control unit 12020 functions as a control device for a keyless entry system, a smart key system, a power window device, or various lamps such as a head lamp, a back lamp, a brake lamp, a blinker, or a fog lamp. In this case, radio waves transmitted from a portable device which substitutes for a key or signals of various switches can be input to the body system control unit 12020. The body system control unit 12020 receives an input of these radio waves or signals and controls a door lock device, a power window device, a lamp, and the like of the vehicle.

The vehicle exterior information detection unit 12030 detects information outside the vehicle in which the vehicle control system 12000 is installed. For example, an imaging unit 12031 is connected to the vehicle exterior information detection unit 12030. The vehicle exterior information detection unit 12030 causes the imaging unit 12031 to capture an image of the outside of the vehicle and receives the captured image. The vehicle exterior information detection unit 12030 may perform object detection processing or distance detection processing relating to a person, a vehicle, an obstacle, a sign, a character on a road surface, or the like on the basis of the received image.

The imaging unit 12031 is an optical sensor which receives light and outputs an electric signal according to an amount of received light. The imaging unit 12031 can output an electric signal as an image or can output an electric signal as distance measurement information. Furthermore, the light received by the imaging unit 12031 may be visible light or light which cannot be seen by eyes such as infrared rays.

The vehicle interior information detection unit 12040 detects information inside the vehicle. For example, a driver state detection unit 12041 which detects a state of a driver is connected to the vehicle interior information detection unit 12040. The driver state detection unit 12041 includes, for example, a camera which images a driver and the vehicle interior information detection unit 12040 may calculate a degree of fatigue or a degree of concentration of the driver or may determine whether or not the driver is dozing off on the basis of the detection information input from the driver state detection unit 12041.

The microcomputer 12051 can calculate a control target value of the driving force generation device, the steering mechanism, or the braking device on the basis of the information inside and outside the vehicle acquired by the vehicle exterior information detection unit 12030 or the vehicle interior information detection unit 12040 and output a control command to the drive system control unit 12010. For example, the microcomputer 12051 can perform cooperative control for the purpose of implementing functions of an advanced driver assistance system (ADAS) including collision avoidance or impact mitigation of the vehicle, follow-up traveling on the basis of an inter-vehicle distance, vehicle speed maintenance traveling, vehicle collision warning, vehicle lane departure warning, or the like.

Furthermore, the microcomputer 12051 controls the driving force generation device, the steering mechanism, the braking device, or the like on the basis of the information around the vehicle acquired by the vehicle exterior information detection unit 12030 or the vehicle interior information detection unit 12040, thereby performing cooperative control for the purpose of automatic driving or the like in which the vehicle autonomously travels without depending on the driver's operation.

Furthermore, the microcomputer 12051 can output a control command to the body system control unit 12020 on the basis of the vehicle exterior information acquired by the vehicle exterior information detection unit 12030. For example, the microcomputer 12051 can perform cooperative control for the purpose of preventing glare, such as switching from a high beam to a low beam, by controlling the headlamp in accordance with the position of a preceding vehicle or an oncoming vehicle detected by the vehicle exterior information detection unit 12030.

The sound/image output unit 12052 transmits an output signal of at least one of a sound or an image to an output device capable of visually or audibly notifying an occupant of the vehicle or a person outside the vehicle of information. In the example of FIG. 18, an audio speaker 12061, a display unit 12062, and an instrument panel 12063 are illustrated as the output device. The display unit 12062 may include, for example, at least one of an on-board display and a head-up display.

Figure 19:
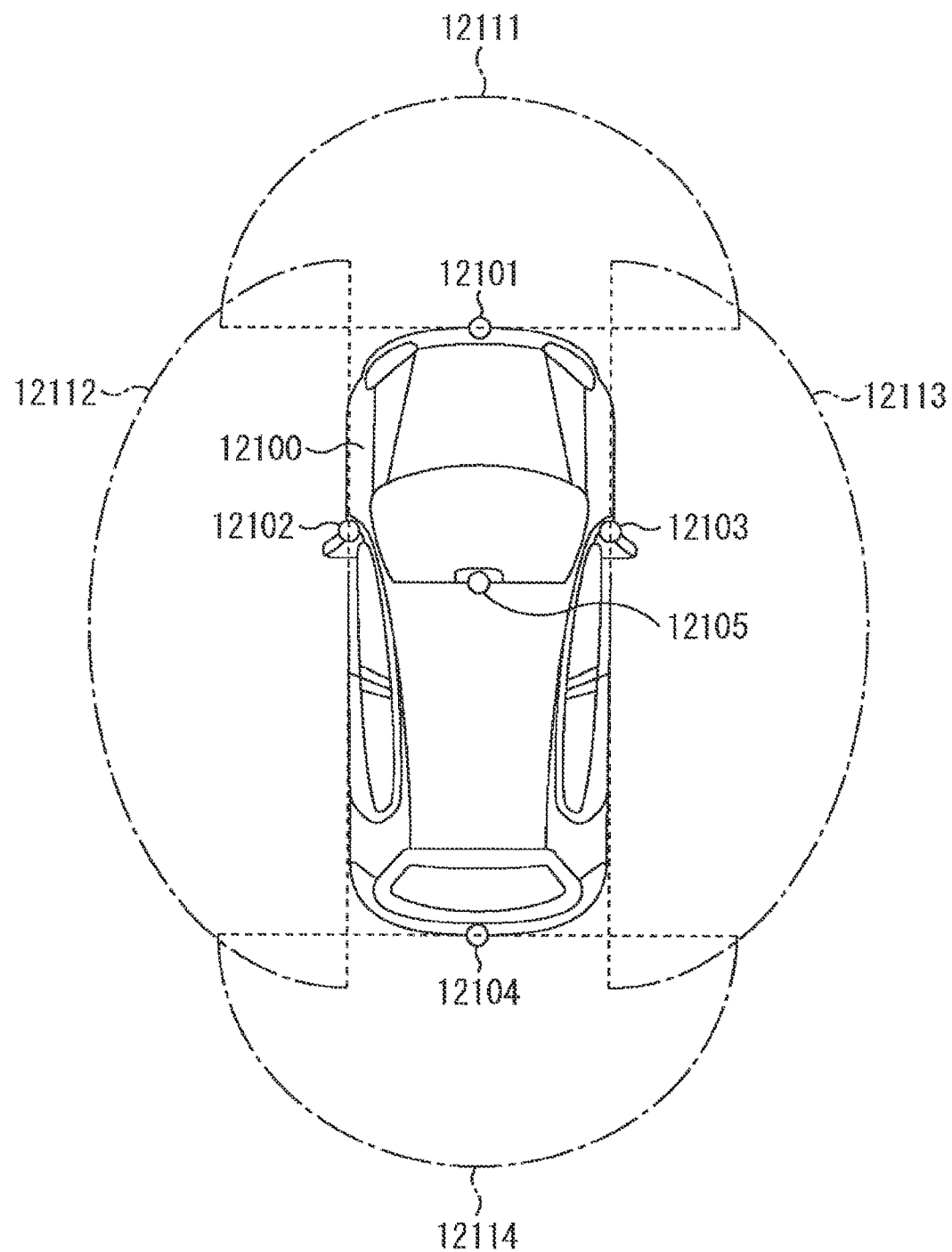
FIG. 19 is an explanatory diagram illustrating an example of installation positions of a vehicle exterior information detector and an imaging unit.

FIG. 19 is a diagram illustrating an example of an installation position of the imaging unit 12031.

In FIG. 19, the vehicle 12100 includes imaging units 12101, 12102, 12103, 12104, and 12105 as the imaging unit 12031.

The imaging units 12101, 12102, 12103, 12104, and 12105 are provided, for example, at positions such as a front nose, a side mirror, a rear bumper, a back door, and an upper portion of a windshield in a vehicle interior of the vehicle 12100. The imaging unit 12101 provided at the front nose and the imaging unit 12105 provided at the upper portion of the windshield in the vehicle interior mainly acquire images of objects in front of the vehicle 12100. The imaging units 12102 and 12103 provided at the side mirrors mainly acquire images of objects on the sides of the vehicle 12100. The imaging unit 12104 provided on the rear bumper or the back door mainly acquires images of objects behind the vehicle 12100. The front images acquired by the imaging units 12101 and 12105 are mainly used for detecting a preceding vehicle, a pedestrian, an obstacle, a traffic light, a traffic sign, a lane, or the like.

Note that FIG. 19 illustrates an example of imaging ranges of the imaging units 12101 to 12104. An imaging range 12111 indicates an imaging range of the imaging unit 12101 provided at the front nose, imaging ranges 12112 and 12113 indicate imaging ranges of the imaging units 12102 and 12103 provided at the side mirrors, respectively, and an imaging range 12114 indicates an imaging range of the imaging unit 12104 provided at the rear bumper or the back door. For example, by superimposing image data captured by the imaging units 12101 to 12104, an overhead view image of the vehicle 12100 when viewed from above is obtained.

At least one of the imaging units 12101 to 12104 may have a function of acquiring distance information. For example, at least one of the imaging units 12101 to 12104 may be a stereo camera including a plurality of imaging elements or may be an imaging element having pixels for phase difference detection.

For example, the microcomputer 12051 obtains a distance from each three-dimensional object in the imaging ranges 12111 to 12114 and a temporal change of the distance (relative speed with respect to the vehicle 12100) on the basis of the distance information obtained from the imaging units 12101 to 12104, thereby extracting, as a preceding vehicle, a three-dimensional object traveling at a predetermined speed (for example, 0 km/h or more) in substantially the same direction as the vehicle 12100, particularly, the closest three-dimensional object on a traveling path of the vehicle 12100. Furthermore, the microcomputer 12051 can set an inter-vehicle distance to be secured in advance in front of the preceding vehicle and can perform automatic brake control (including follow-up stop control), automatic acceleration control (including follow-up start control), and the like. As described above, it is possible to perform cooperative control for the purpose of automatic driving or the like in which the vehicle autonomously travels without depending on the driver's operation.

For example, on the basis of the distance information obtained from the imaging units 12101 to 12104, the microcomputer 12051 can classify three-dimensional object data regarding three-dimensional objects into two-wheeled vehicles, ordinary vehicles, large vehicles, pedestrians, and other three-dimensional objects such as utility poles, extract the three-dimensional object data, and use the three-dimensional object data for automatic avoidance of obstacles. For example, the microcomputer 12051 identifies obstacles around the vehicle 12100 as obstacles which can be visually recognized by the driver of the vehicle 12100 and obstacles which are difficult to visually recognize. Also, the microcomputer 12051 determines a collision risk indicating a risk of collision with each obstacle, and when the collision risk is a set value or more and there is a possibility of collision, the microcomputer can perform driving assistance for collision avoidance by outputting an alarm to the driver via the audio speaker 12061 or the display unit 12062 or performing forced deceleration or avoidance steering via the drive system control unit 12010.

At least one of the imaging units 12101 to 12104 may be an infrared camera which detects infrared rays. For example, the microcomputer 12051 can recognize a pedestrian by determining whether or not a pedestrian is present in the captured images of the imaging units 12101 to 12104. Such pedestrian recognition is performed using, for example, a procedure of extracting feature points in the captured images of the imaging units 12101 to 12104 as infrared cameras and a procedure of performing pattern matching processing on a series of feature points indicating an outline of an object to determine whether or not the object is a pedestrian. If the microcomputer 12051 determines that a pedestrian is present in the captured images of the imaging units 12101 to 12104 and recognizes that the object is the pedestrian, the audio image output unit 12052 controls the display unit 12062 to superimpose and display a square contour line for emphasis on the recognized pedestrian. Furthermore, the audio image output unit 12052 may control the display unit 12062 to display an icon or the like indicating a pedestrian at a desired position.

An example of the vehicle control system to which the technique according to the present disclosure can be applied has been described above. The technique according to the present disclosure can be applied to, for example, the imaging unit 12031 among the above-described configurations. Specifically, the imaging element according to the present disclosure can be installed in the imaging unit 12031. By applying the technique according to the present disclosure to the imaging unit 12031, it is possible to improve the resolution of the distance image while preventing the generation of electromagnetic noise and it is possible to enhance the functionality and safety of the vehicle 12100.

Note that the present technique can have the following configurations.

(1) An imaging element including:
a signal generator configured to generate a clock signal;
a plurality of flip-flops connected in a cascade manner;
a circuit block configured to supply a first signal to a clock terminal of each of the plurality of flip-flops and to supply a second signal to an input terminal of a first-stage flip-flop of the plurality of flip-flops in accordance with the clock signal; and
a pixel array including pixels configured to be driven using pulse signals supplied from different stages of the plurality of flip-flops.

(2) The imaging element according to (1), in which
the pixel in the pixel array includes a signal taking-out unit configured to detect charges generated through photoelectric conversion if the pulse signal is supplied.

(3) The imaging element according to (2), in which
the pixel in the pixel array includes a plurality of the signal taking-out units and each of the signal taking-out units is configured to detect the charges generated at different timings.

(4) The imaging element according to any one of (1) to (3), further including:
a plurality of clock distribution circuits connected to the stage of any one of the plurality of flip-flops on an input side and connected to the pixel in the pixel array via a drive line on an output side.

(5) The imaging element according to (4), in which
at least one of the clock distribution circuits is a clock tree method.

(6) The imaging element according to any one of (1) to (5), in which
a pixel column or a pixel row in the pixel array is configured to be driven using the pulse signal supplied from the common stage of the plurality of flip-flops.

(7) The imaging element according to any one of (1) to (6), in which
the pulse signals configured to be supplied from the different stages of the plurality of flip-flops depending on a region in the pixel array in which the pixel is disposed.

(8) The imaging element according to any one of (1) to (7), further including:
a multiplexer configured to select the pulse signal supplied to the pixel in the pixel array.

(9) The imaging element according to any one of (1) to (8), in which
the circuit block is configured to output the first signal having a first frequency and output the second signal having a second frequency different from the first frequency.

(10) The imaging element according to any one of (1) to (9), in which
the circuit block is configured to output the first signal and the second signal in synchronization with each other.
(11) The imaging element according to any one of (1) to (10), in which
the circuit block further includes a frequency divider circuit which generates the first signal on the basis of the clock signal.
(12) The imaging element according to any one of (1) to (10), in which
the circuit block is configured to output the first signal having a first frequency equal to a clock frequency of the clock signal.
(13) The imaging element according to any one of (1) to (12), further including:
a control unit configured to output a control signal to the circuit block,
in which the circuit block is configured to adjust a first frequency of the first signal or a second frequency of the second signal on the basis of a supplied control signal.
(14) A distance measuring device including:
a signal generator configured to generate a clock signal;
a plurality of flip-flops connected in a cascade manner;
a circuit block configured to supply a first signal to a clock terminal of each of the plurality of flip-flops and to supply a second signal to an input terminal of a first-stage flip-flop of the plurality of flip-flops in accordance with the clock signal;
a pixel array including pixels configured to be driven using pulse signals supplied from different stages of the plurality of flip-flops; and
a signal processing unit configured to generate a distance image on the basis of a charge generated by photoelectric conversion in the pixel of the pixel array.
(15) An electronic device including:
a signal generator configured to generate a clock signal;
a plurality of flip-flops connected in a cascade manner;
a circuit block configured to supply a first signal to a clock terminal of each of the plurality of flip-flops and to supply a second signal to an input terminal of a first-stage flip-flop of the plurality of flip-flops in accordance with the clock signal; and
a pixel array including pixels configured to be driven using pulse signals supplied from different stages of the plurality of flip-flops.

Aspects of the present disclosure are not limited to the above-described individual embodiments, but include various modifications which can be conceived by those skilled in the art. In addition, the effects of the present disclosure are not limited to the above-described details. That is to say, various additions, modifications, and partial deletions are possible without departing from the conceptual idea and spirit of the present disclosure derived from the details defined in the claims and equivalents thereof.

REFERENCE SIGNS LIST

1 Electronic device
11, 11A Imaging element
21 Pixel array unit
22, 22A, 22B Pixel drive unit
23 Column processing unit
24 Lead drive unit
25 System control unit
26 Signal processing unit
27 Data storage unit
30, 30A, 30B, 30C, 30C-1, 30C-2, 30C-3 Pulse generator
31 PLL
32 Timing control unit
33, 33A, 370, 370A, 380 Circuit block
35 Frequency divider circuit
36 Multiplexer
37, 371, 372, 373, 374, 381, 382, 383, 384 Clock distribution circuit
240 Analog-to-digital converter
340, 341, 342, 343, 344, 345, 346, 347 Flip-flop
1000 Distance measuring module
1011 Light emitting unit
1012 Light emission control unit
1013 Light receiving unit

The invention claimed is:
1. An imaging element, comprising:
a signal generator configured to generate a clock signal;
a plurality of flip-flops connected in a cascade manner;
a circuit block configured to:
supply a first signal to a clock terminal of each of the plurality of flip-flops based on the clock signal; and
supply a second signal to an input terminal of a first-stage flip-flop of the plurality of flip-flops based on the clock signal; and
a pixel array including pixels, wherein
the pixel array is configured to receive pulse signals from different stages of the plurality of flip-flops,
the pixels are driven based on the pulse signals received from the different stages of the plurality of flip-flops,
each of the pixels in the pixel array includes a signal taking-out unit, and
the signal taking-out unit includes an N+ semiconductor region, an N− semiconductor region, a P+ semiconductor region, and a P− semiconductor region.
2. The imaging element according to claim 1, wherein
the signal taking-out unit is configured to detect charges generated through photoelectric conversion in a case of the reception of the pulse signals.
3. The imaging element according to claim 2, wherein
each of the pixels in the pixel array further includes a plurality of signal taking-out units,
the plurality of signal taking-out units includes the signal taking-out unit, and
each of the plurality of signal taking-out units is configured to detect the charges generated at different timings.
4. The imaging element according to claim 1, further comprising:
a plurality of clock distribution circuits connected to a stage of the different stages of one of the plurality of flip-flops on an input side,
wherein the plurality of clock distribution circuits are connected to the pixels in the pixel array via a drive line on an output side.
5. The imaging element according to claim 4, wherein
at least one of the plurality of clock distribution circuits is a clock tree method.
6. The imaging element according to claim 1, wherein
one of a pixel column or a pixel row in the pixel array is driven based on the pulse signals received from a common stage of the plurality of flip-flops.
7. The imaging element according to claim 1, wherein
the pulse signals are supplied from the different stages of the plurality of flip-flops based on a region in the pixel array in which the pixels are disposed.

8. The imaging element according to claim 1, further comprising:
a multiplexer configured to select the pulse signals supplied to the pixels in the pixel array.

9. The imaging element according to claim 1, wherein the circuit block is further configured to:
output the first signal having a first frequency; and
output the second signal having a second frequency different from the first frequency.

10. The imaging element according to claim 1, wherein the circuit block is further configured to output the first signal in synchronization with the second signal.

11. The imaging element according to claim 1, wherein the circuit block further includes a frequency divider circuit that is configured to generate the first signal based on the clock signal.

12. The imaging element according to claim 1, wherein the circuit block is further configured to output the first signal having a first frequency equal to a clock frequency of the clock signal.

13. The imaging element according to claim 1, further comprising:
a control unit configured to output a control signal to the circuit block,
wherein the circuit block is further configured to adjust a first frequency of the first signal or a second frequency of the second signal based on the control signal.

14. A distance measuring device, comprising:
a signal generator configured to generate a clock signal;
a plurality of flip-flops connected in a cascade manner;
a circuit block configured to:
supply a first signal to a clock terminal of each of the plurality of flip-flops based on the clock signal; and
supply a second signal to an input terminal of a first-stage flip-flop of the plurality of flip-flops based on the clock signal;
a pixel array including pixels, wherein
the pixel array is configured to receive pulse signals from different stages of the plurality of flip-flops,
the pixels are driven based on the pulse signals received from the different stages of the plurality of flip-flops,
each of the pixels in the pixel array includes a signal taking-out unit, and
the signal taking-out unit includes an N+ semiconductor region, an N− semiconductor region, a P+ semiconductor region, and a P− semiconductor region; and
a signal processing unit configured to generate a distance image based on a charge, wherein the charge is generated based on photoelectric conversion in the pixels of the pixel array.

15. An electronic device, comprising:
a signal generator configured to generate a clock signal;
a plurality of flip-flops connected in a cascade manner;
a circuit block configured to:
supply a first signal to a clock terminal of each of the plurality of flip-flops based on the clock signal; and
supply a second signal to an input terminal of a first-stage flip-flop of the plurality of flip-flops based on the clock signal; and
a pixel array including pixels, wherein
the pixel array is configured to receive pulse signals from different stages of the plurality of flip-flops,
the pixels are driven based on the pulse signals received from the different stages of the plurality of flip-flops,
each of the pixels in the pixel array includes a signal taking-out unit, and
the signal taking-out unit includes an N+ semiconductor region, an N− semiconductor region, a P+ semiconductor region, and a P− semiconductor region.

* * * * *